(12) United States Patent
Lee et al.

(10) Patent No.: US 10,714,599 B2
(45) Date of Patent: Jul. 14, 2020

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Yun Il Lee, Anyang-si (KR); Sung Il Park, Suwon-si (KR); Jae Hyun Park, Hwaseong-si (KR); Hyung Suk Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/249,298

(22) Filed: Jan. 16, 2019

(65) Prior Publication Data

US 2019/0312124 A1 Oct. 10, 2019

(30) Foreign Application Priority Data

Apr. 6, 2018 (KR) ........................ 10-2018-0040373

(51) Int. Cl.
| | |
|---|---|
| *H01L 29/66* | (2006.01) |
| *H01L 27/092* | (2006.01) |
| *H01L 29/06* | (2006.01) |
| *H01L 21/8238* | (2006.01) |
| *H01L 29/78* | (2006.01) |
| *H01L 21/02* | (2006.01) |
| *H01L 29/08* | (2006.01) |

(52) U.S. Cl.
CPC ...... *H01L 29/6681* (2013.01); *H01L 21/0217* (2013.01); *H01L 21/823814* (2013.01); *H01L 21/823821* (2013.01); *H01L 27/0924* (2013.01); *H01L 29/0653* (2013.01); *H01L 29/0847* (2013.01); *H01L 29/7848* (2013.01)

(58) Field of Classification Search
CPC ............ H01L 29/6681; H01L 29/0653; H01L 29/0847; H01L 29/7848; H01L 21/0217; H01L 21/823814; H01L 21/823821; H01L 27/0924
See application file for complete search history.

(56) References Cited

U.S. PATENT DOCUMENTS

| | | | |
|---|---|---|---|
| 9,178,019 B2 | 11/2015 | Cheng et al. | |
| 9,257,505 B2 | 2/2016 | Lai et al. | |
| 9,373,641 B2 | 6/2016 | Anderson et al. | |
| 9,461,043 B1 | 10/2016 | Chang et al. | |

(Continued)

*Primary Examiner* — Yosef Gebreyesus
(74) *Attorney, Agent, or Firm* — Harness, Dickey & Pierce, P.L.C.

(57) ABSTRACT

A semiconductor device including a first fin type pattern and a second fin type pattern which protrude from a substrate and are spaced apart from each other to extend in a first direction, a dummy fin type pattern protruding from the substrate between the first fin type pattern and the second fin type pattern, a first gate structure extending in a second direction intersecting with the first direction, on the first fin type pattern, a second gate structure extending in the second direction, on the second fin type pattern, and a capping pattern extending in the second direction, on the first gate structure and the second gate structure, wherein the capping pattern includes a separation part which is in contact with an upper surface of the dummy fin type pattern, and the dummy fin type pattern and the separation part separate the first gate structure and the second gate structure.

20 Claims, 33 Drawing Sheets

(56) References Cited

U.S. PATENT DOCUMENTS

| | | |
|---|---|---|
| 9,553,090 B2 | 1/2017 | Chang et al. |
| 9,559,009 B2 | 1/2017 | Cai et al. |
| 9,564,438 B2 | 2/2017 | Kanakasabapathy |
| 9,653,466 B2 | 5/2017 | Yang et al. |
| 9,659,827 B2 | 5/2017 | You et al. |
| 9,659,930 B1 | 5/2017 | Yu et al. |
| 9,773,879 B2 | 9/2017 | Huang et al. |
| 9,806,166 B2 | 10/2017 | Myung et al. |
| 9,818,836 B1 | 11/2017 | Sung et al. |
| 9,837,410 B1 | 12/2017 | Cheng |
| 2013/0309838 A1* | 11/2013 | Wei ................... H01L 21/76229 438/424 |
| 2014/0145247 A1* | 5/2014 | Cheng ............... H01L 29/66545 257/288 |
| 2015/0206759 A1* | 7/2015 | Tsao ................... H01L 29/0653 257/506 |
| 2016/0336320 A1 | 11/2016 | Lin |
| 2017/0140992 A1* | 5/2017 | Chang ............... H01L 21/82341 |
| 2017/0141210 A1 | 5/2017 | Yang |
| 2017/0148682 A1 | 5/2017 | Basker et al. |
| 2017/0338225 A1 | 11/2017 | Ching et al. |

* cited by examiner

SEMICONDUCTOR DEVICE AND METHOD FOR FABRICATING THE SAME

CROSS-REFERENCE TO RELATED APPLICATION

This application claims priority under 35 U.S.C. § 119 to Korean Patent Application No. 10-2018-0040373, filed on Apr. 6, 2018, in the Korean Intellectual Property Office, the disclosure of which is hereby incorporated by reference in its entirety.

BACKGROUND

1. Field

The present inventive concepts relate to a semiconductor device and a method for fabricating the same. More specifically, the present inventive concepts relate to a semiconductor device in which a gate cut is implemented and a method for fabricating the same.

2. Description of the Related Art

As one of scaling techniques for increasing the density of an integrated circuit device, a multi-gate transistor in which a silicon body having a fin shape or a nanowire shape is formed on a substrate and a gate is formed on the surface of the silicon body has been proposed.

Since such a multi-gate transistor utilizes three-dimensional channels, scaling is easily performed. In addition, even if the gate length of the multi-gate transistor is not increased, the current control capability may be improved. Furthermore, it is possible to effectively suppress a SCE (short channel effect) in which the potential of the channel region is affected by the drain voltage.

SUMMARY

An aspect of the present inventive concepts provides a semiconductor device with improved product reliability.

Another aspect of the present inventive concepts provides a method for fabricating a semiconductor device capable of fabricating a semiconductor device with improved product reliability.

The aspects of the present inventive concepts are not restricted to those set forth therein and another aspect which is not mentioned may be clearly understood by those skilled in the art from the description below.

According to an aspect of the present inventive concepts, there is provided a semiconductor device comprising a first fin type pattern and a second fin type pattern which protrude from a substrate and are spaced apart from each other to extend in a first direction, a dummy fin type pattern protruding from the substrate between the first fin type pattern and the second fin type pattern, a first gate structure extending in a second direction intersecting with the first direction, on the first fin type pattern, a second gate structure extending in the second direction, on the second fin type pattern, and a capping pattern extending in the second direction, on the first gate structure and the second gate structure, wherein the capping pattern includes a separation part which is in contact with an upper surface of the dummy fin type pattern, and the dummy fin type pattern and the separation part separate the first gate structure and the second gate structure.

According to an aspect of the present inventive concepts, there is provided a semiconductor device comprising a dummy fin type pattern which protrudes from a substrate and extends in a first direction, a first gate electrode which extends in a second direction intersecting with the first direction, on the dummy fin type pattern, a first capping pattern which extends in the second direction and is in contact with the dummy fin type pattern, on the first gate electrode, an insulating liner extending along sidewalls of the gate electrode and sidewalls of the first capping pattern, and an interlayer insulating film on the insulating liner, wherein the first gate electrode is electrically separated by the dummy fin type pattern and the first capping pattern, the dummy fin type pattern includes a trench formed in the dummy fin type pattern on both sides of the first capping pattern, and the insulating liner further extends along the lower surface and the sidewalls of the trench.

According to an aspect of the present inventive concepts, there is provided a semiconductor device comprising a dummy fin type pattern protruding from a substrate and extending in a first direction, a field insulation film which surrounds a part of sidewalls of the dummy fin type pattern, on the substrate, a capping pattern which is in contact with an upper surface of the dummy fin type pattern, on the dummy fin type pattern, and a gate electrode extending in a second direction intersecting with the first direction and electrically separated by the dummy fin type pattern and the capping pattern, on the field insulation film, wherein a lower surface of the capping pattern is lower than or the same as the upper surface of the dummy fin type pattern and is higher than the upper surface of the field insulation film.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF EXAMPLE EMBODIMENTS

Hereinafter, semiconductor devices according to some embodiments of the technical idea of the present inventive concepts will be described with reference to FIGS. 1 to 15.

Figure 1:
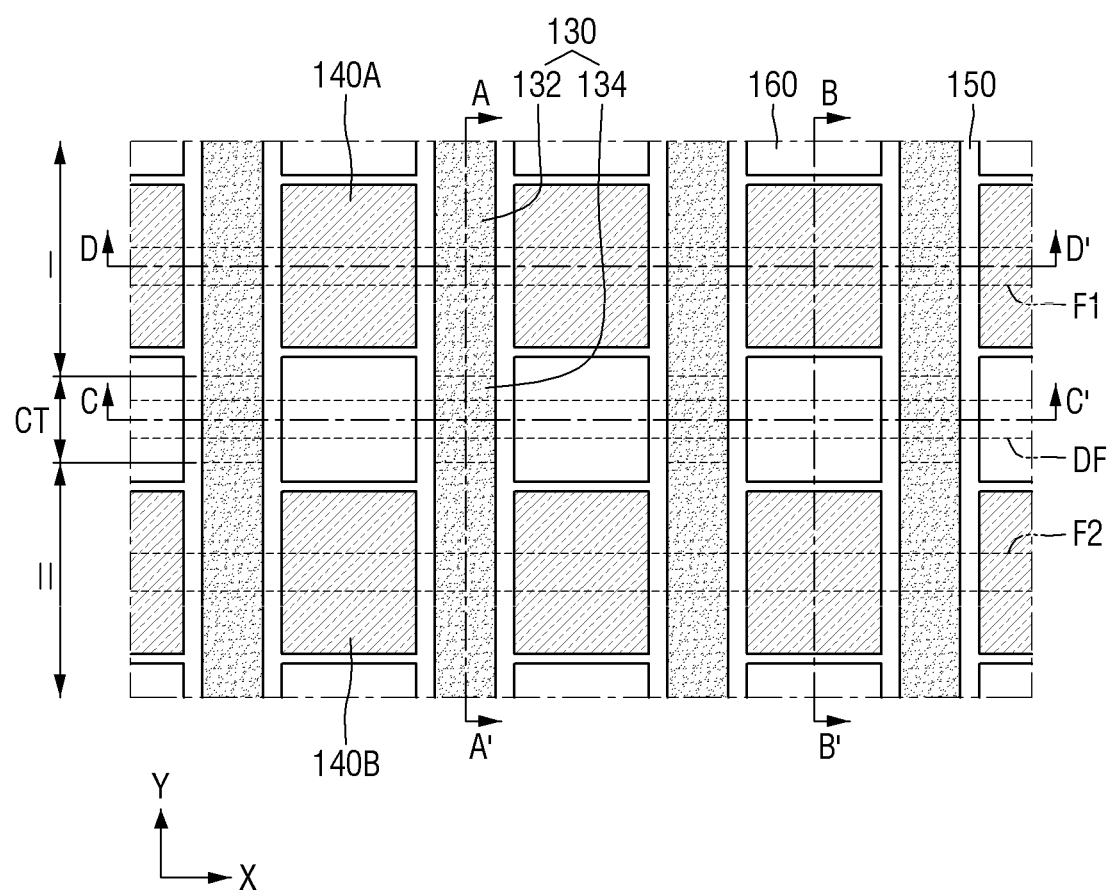
FIG. 1 is a layout diagram of the semiconductor device according to some embodiments of the technical idea of the present inventive concepts.
Figure 2:
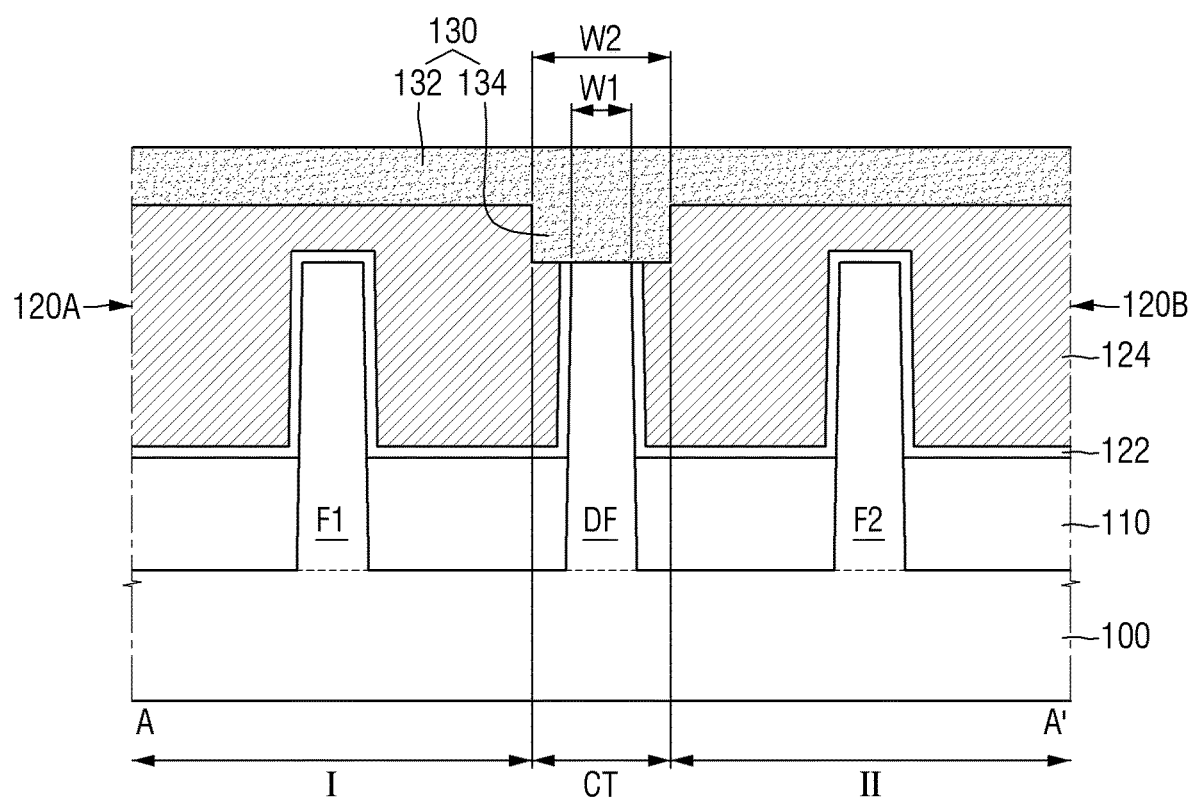
FIG. 2 is a cross-sectional view taken along line A-A' of FIG. 1.
Figure 3:
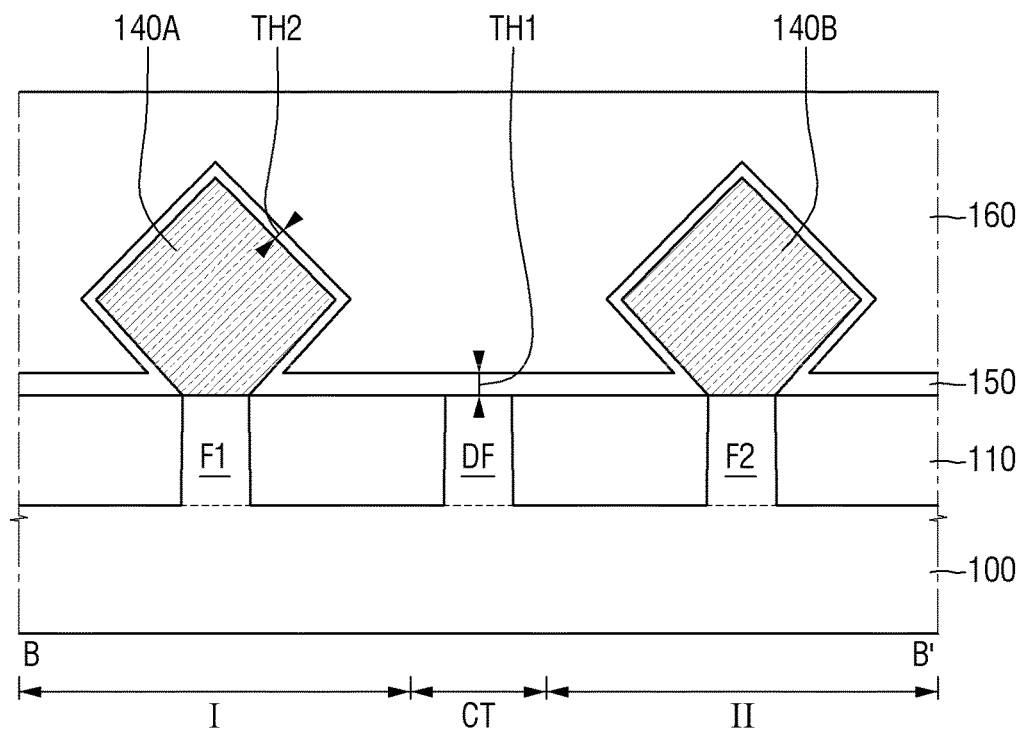
FIG. 3 is a cross-sectional view taken along line B-B' of FIG. 1.
Figure 4:
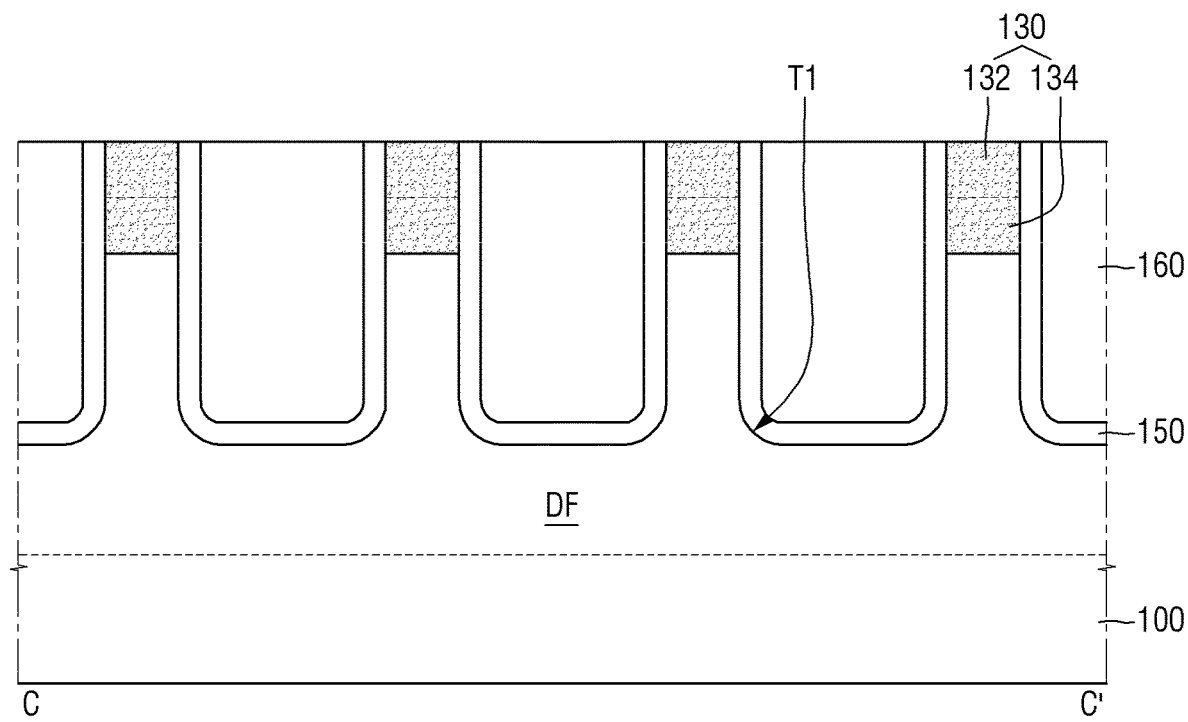
FIG. 4 is a cross-sectional view taken along line C-C' of FIG. 1.
Figure 5:
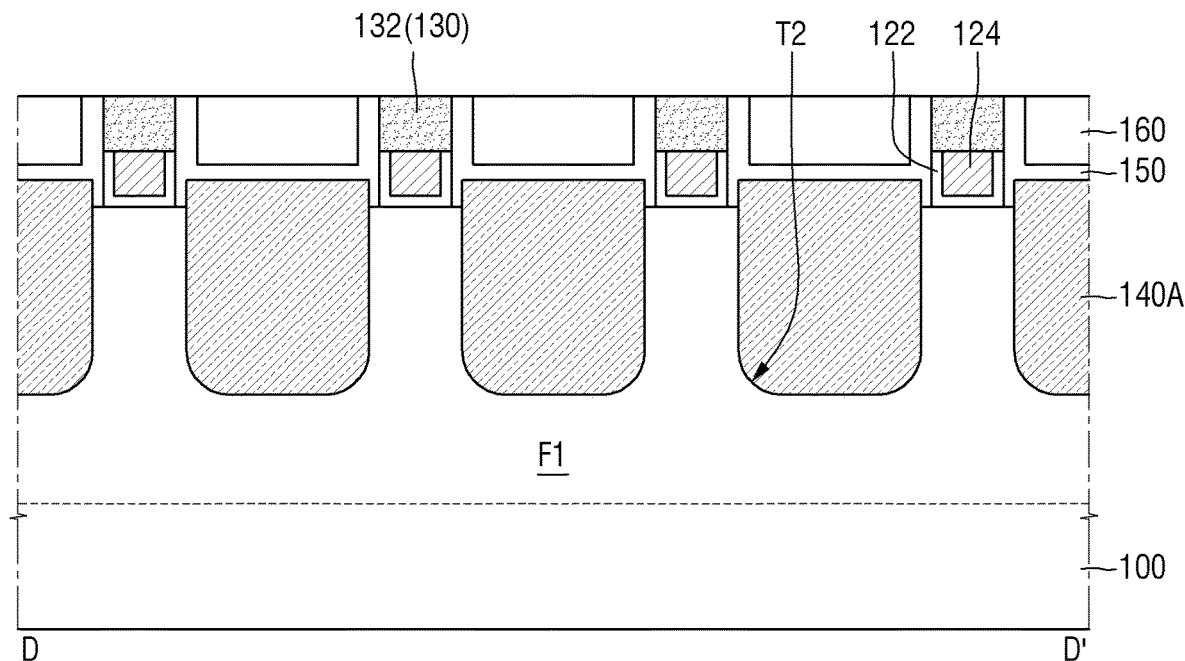
FIG. 5 is a cross-sectional view taken along the line D-D' of FIG. 1.

FIG. 1 is a layout diagram of the semiconductor device according to some embodiments of the technical idea of the present inventive concepts. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. FIG. 5 is a cross-sectional view taken along the line D-D' of FIG. 1.

Referring to FIGS. 1 through 5, a semiconductor device according to some embodiments includes a substrate 100, a first fin type pattern F1, a dummy fin type pattern DF, a second fin type pattern F2, a field insulation film 110, a first gate dielectric film 122, a first gate electrode 124, a first capping pattern 130, a first source/drain region 140A, a second source/drain region 140B, an insulating liner 150 and/or an interlayer insulating film 160.

The substrate 100 may be, for example, bulk silicon or silicon-on-insulator (SOI). The substrate 100 may include a semiconductor material. For example, the substrate 100 may be a silicon substrate or may include other materials, for example, as silicon germanium, indium antimonide, lead tellurium compound, indium arsenide, indium phosphide, gallium arsenide or gallium antimonide. Or, the substrate 100 may have an epitaxial layer formed on a base substrate. For convenience of explanation, the substrate 100 is illustrated as a silicon substrate below.

The substrate 100 may include a first region I, a separation region CT and a second region II. The separation region CT may be interposed between the first region I and the second region II. For example, as illustrated in FIG. 1, the first region I and the second region II may be spaced apart from each other by the separation region CT.

In some embodiments, semiconductor elements of different conductivity types may be formed in the first region I and the second region II. For example, a PMOS transistor may be formed in the first region I, and an NMOS transistor may be formed in the second region II. However, the technical idea of the present disclosure is not limited thereto, and semiconductor elements of the same conductivity type may be formed in the first region I and the second region II.

The first fin type pattern F1, the dummy fin type pattern DF, and the second fin type pattern F2 may protrude from the substrate to extend in a longitudinal direction. For example, the first fin type pattern F1, the dummy fin type pattern DF and the second fin type pattern F2 may have short sides and long sides, respectively. In FIG. 1, the long side of the first fin type pattern F1, the long side of the dummy fin type pattern DF and the long side of the second fin type pattern F2 are illustrated to extend along a first direction X. That is, the first fin type pattern F1, the dummy fin type pattern DF and the second fin type pattern F2 may extend along the first direction X on the substrate 100, respectively.

The first fin type pattern F1, the dummy fin type pattern DF, and the second fin type pattern F2 may extend to be spaced apart from each other on the substrate 100. For example, the first fin type pattern F1 may be formed on the first region I of the substrate 100. The dummy fin type pattern DF may be formed on the separation region CT of the substrate 100. The second fin type pattern F2 may be formed on the second region II of the substrate 100.

The first fin type pattern F1, the dummy fin type pattern DF, and the second fin type pattern F2 may be parts of the substrate 100, and may include an epitaxial layer which is grown from the substrate 100. As a result, the first fin type pattern F1, the dummy fin type pattern DF and the second fin type pattern F2 may include a semiconductor material. For example, the first fin type pattern F1, the dummy fin type pattern DF, and the second fin type pattern F2 may include silicon or germanium which is an element semiconductor material. The first fin type pattern F1, the dummy fin type pattern DF, and the second fin type pattern F2 may include a compound semiconductor, for example, a group IV-IV compound semiconductor or a group III-V compound semiconductor.

More specifically, taking a case where the first fin type pattern F1, the dummy fin type pattern DF and the second fin type pattern F2 include a group IV-IV compound semiconductor as an example, the fin type pattern F1, the dummy fin type pattern DF and the second fin type pattern F2 may include a binary compound or a ternary compound including at least two or more among carbon (C), silicon (Si), germanium (Ge) and tin (Sn), or a compound obtained by doping these elements with a group IV element.

Taking a case where the first fin type pattern F1, the dummy fin type pattern DF and the second fin type pattern F2 include group III-V compound semiconductors as an example, the first fin type pattern F1, the dummy fin type pattern DF and the second fin type pattern F2 may include a binary compound, a ternary compound, or a quaternary compound formed by bonding at least one of aluminum (Al), gallium (Ga) and indium (In) as group III element with phosphorus (P), arsenic (As), and antimony (Sb) as a group V element.

For convenience of explanation, the first fin type pattern F1, the dummy fin type pattern DF and the second fin type pattern F2 will be described as a silicon fin type pattern below.

The field insulation film 110 may be formed on the substrate 100. Further, the field insulation film 110 may surround a part of the first fin type pattern F1, a part of the dummy fin type pattern DF and a part of the second fin type pattern F2. For example, as illustrated in FIG. 2, the field insulation film 110 may surround a part of sidewalls of the first fin type pattern F1, a part of the sidewalls of the dummy fin type pattern DF and a part of the sidewalls of the second fin type pattern F2.

In FIG. 3, the upper surface of the field insulation film 110 is illustrated to have the same height as the upper surface of a part of the first fin type pattern F1, the upper surface of a part of the dummy fin type pattern DF and the upper surface of a apart of the second fin type pattern F2, but the technical idea of the present disclosure is not limited thereto. For example, in FIG. 3, the first fin type pattern F1, the dummy fin type pattern DF and the second fin type pattern F2 may protrude upward from the field insulation film 110.

The first gate electrode 124 may be formed on the first fin type pattern F1, the dummy fin type pattern DF and the second fin type pattern F2. The upper surface of the first gate electrode 124 may be higher than the upper surface of the first fin type pattern F1, the upper surface of the dummy fin type pattern DF, and the upper surface of the second fin type pattern F2.

Further, the first gate electrode 124 may intersect with the first fin type pattern F1, the dummy fin type pattern DF and the second fin type pattern F2. For example, the first gate electrode 124 may extend in a second direction Y intersecting with the first direction X.

The first gate electrode 124 may include a conductive material. For example, the first gate electrode 124 may include a metal layer. For example, the first gate electrode 124 may include at least one of Ti, Ta, W, Al, Co and combinations thereof. However, the technical idea of the present disclosure is not limited thereto, and the first gate electrode 124 may be made of silicon, silicon germanium or the like rather than metal.

The first gate electrode 124 is illustrated as being a single film, but the technical idea of the present disclosure is not limited thereto. For example, the first gate electrode 124 may be formed by stacking a plurality of conductive materials. For example, the first gate electrode 124 may include a work function adjustment film for adjusting a work function, and a filling conductive film for filling a space formed by the work function adjustment film. The work function adjustment films may include at least one of, for example, TiN, TaN, TiC, TaC, TiAlC, and combinations thereof. The filling conductive film may include, for example, W or Al.

The first gate electrode 124 may be formed, for example, through a replacement process, but the technical idea of the present disclosure is not limited thereto.

The first gate dielectric film 122 may be interposed between the substrate 100 and the first gate electrode 124. For example, as illustrated in FIG. 2, the first gate dielectric film 122 may extend along a profile of the upper surface of the field insulation film 110 and profiles of the fin type patterns (e.g., the first fin type pattern F1, the dummy fin type pattern DF and the second fin type pattern F2) exposed by the field insulation film 110. However, in some embodiments, the first gate dielectric film 122 may not be formed on the upper surface of the dummy fin type pattern DF.

Also, as illustrated in FIG. 5, the first gate dielectric film 122 may extend along the inner wall of the insulating liner 150. However, in some embodiments, the first gate dielectric film 122 may not extend along the inner wall of the insulating liner 150.

The first gate dielectric film 122 may include, for example, at least one of silicon oxide ($SiO_2$), silicon oxynitride (SiON), silicon nitride (SiN), or a high dielectric constant material having a dielectric constant larger than silicon oxide ($SiO_2$). The high dielectric constant material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

The first capping pattern 130 may be formed on the first gate electrode 124 and the dummy fin type pattern DF. Further, the first capping pattern 130 may extend lengthwise the second direction Y.

In the separation region CT, a part of the first capping pattern 130 protrudes downward and may make contact with the dummy fin type pattern DF. For example, as illustrated in FIG. 2, the first capping pattern 130 may include an extension part 132 and a separation part 134. The extension part 132 of the first capping pattern 130 may extend in the second direction Y on the first gate electrode 124. The extension part 132 of the first capping pattern 130 may be formed over the first region I, the separation region CT and the second region II. The separation part 134 of the first capping pattern 130 protrudes from the lower surface of the extension part 132 of the separation region CT and may come into contact with the upper surface of the dummy fin type pattern DF.

Accordingly, in the separation region CT, the first gate dielectric film 122 and the first gate electrode 124 may be separated by the dummy fin type pattern DF and the first capping pattern 130. For example, as illustrated in FIG. 2, a first gate structure 120A and a second gate structure 120B separated by the dummy fin type pattern DF and the first capping pattern 130 may be formed.

The first gate structure 120A may be a part of the first gate dielectric film 122 and the first gate electrode 124 extending in the second direction Y on the first fin type pattern F1. Further, the second gate structure 120B may be a part of the first gate dielectric film 122 and the first gate electrode 124 extending in the second direction Y on the second fin type pattern F2. The dummy fin type pattern DF and the separation part 134 may be interposed between the first gate structure 120A and the second gate structure 120B to separate them.

The first capping pattern 130 may include an insulating material. For example, the first capping pattern 130 may include a low dielectric constant material having a dielectric constant lower than that of silicon oxide. The first capping pattern 130 may include, for example, silicon nitride. Thus, the first gate electrode 124 may be electrically separated by the dummy fin type pattern DF and the first capping pattern 130. That is, the first gate structure 120A and the second gate structure 120B which are electrically separated by the separation region CT may be formed. Further, the semiconductor element formed in the first region I and the semiconductor element formed in the second region II may be separated from each other.

In some embodiments, a width of the separation part 134 of the first capping pattern 130 may be greater than a width of the dummy fin type pattern DF. Here, the "width" means the width in the second direction Y. For example, as illustrated in FIG. 2, the first width W1 of the dummy fin type pattern DF may be smaller than the second width W2 of the separation part 134.

In FIG. 2, the width of the separation part 134 is illustrated as being substantially the same as it goes away from the upper surface of the substrate 100, but the technical idea of the present disclosure is not limited thereto. For example, the separation part 134 may have a tapered shape depending on the characteristics of an etching process for forming the separation part 134. For example, unlike the illustrated configuration, the width of the separation part 134 may increase as it goes away from the upper surface of the substrate 100.

In some embodiments, the first capping pattern 130 may not include the extension part 132. For example, the first capping pattern 130 may be formed only between the first gate structure 120A and the second gate structure 120B, and may not extend along the upper surface of the first gate electrode 124.

In some embodiments, the dummy fin type pattern DF may include a first trench T1. As illustrated in FIG. 4, the first trench T1 may be formed in the dummy fin type pattern DF on both sides of the first capping pattern 130.

A first source/drain region 140A may be formed in the first fin type pattern F1 on both sides of the first gate electrode 124. That is, the first source/drain region 140A may be formed in the first fin type pattern F1 on both sides of the first gate structure 120A. However, the first source/drain region 140A may be insulated from the first gate electrode 124 by the insulating liner 150. As a result, the first source/drain region 140A may function as a source/drain of a transistor including the first gate structure 120A.

The second source/drain region 140B may be formed in the second fin type pattern F2 on both sides of the first gate electrode 124. That is, the second source/drain region 140B may be formed in the second fin type pattern F2 on both sides of the second gate structure 120B. However, the second source/drain region 140B may be insulated from the first gate electrode 124 by the insulating liner 150. Thus, the second source/drain region 140B may function as a source/drain of the transistor including the second gate structure 120B.

In some embodiments, the first and second source/drain regions 140A and 140B may be formed by an epitaxial growth method. For example, as illustrated in FIG. 5, the first fin type pattern F1 may include a second trench T2. The second trench T2 may be formed in the first fin type pattern F1 on both sides of the first gate structure 120A. At this time, the first source/drain region 140A may be formed to fill the second trench T2 by the epitaxial growth method.

In some embodiments, the first source/drain region 140A and the second source/drain region 140B may be elevated source/drains. For example, as illustrated in FIG. 5, the uppermost part of the first source/drain region 140A may protrude upward from the upper surface of the first fin type pattern F1. Also, in some embodiments, the first source/drain region 140A or the second source/drain region 140B may be a common source/drain common to the plurality of gate electrodes.

The first source/drain region 140A and the second source/drain region 140B are illustrated as being a single film, but the technical idea of the present disclosure is not limited thereto. For example, the first source/drain region 140A or the second source/drain region 140B may be formed of multi-films including the impurities of different concentrations.

In FIG. 3, the cross section of the first source/drain region 140A and the cross section of the second source/drain region 140B are illustrated to have a pentagonal shape, but the technical idea of the present disclosure is limited thereto. The cross section of the first source/drain region 140A and the cross section of the second source/drain region 140B may have various shapes such as, for example, a diamond shape or a hexagonal shape.

In the case where the semiconductor element to be formed is a PMOS transistor, the first source/drain region 140A or the second source/drain region 140B may include p-type impurity or an impurity for reducing or preventing diffusion of the p-type impurity. For example, the first source/drain region 140A or the second source/drain region 140B may include at least one of B, C, In, Ga, and Al or combinations thereof.

Also, when the semiconductor element to be formed is a PMOS transistor, the first source/drain region 140A or the second source/drain region 140B may include a compressive stress material. For example, when the first fin type pattern F1 is silicon (Si), the first source/drain region 140A or the second source/drain region 140B may include a material having a lattice constant greater than Si, for example, silicon germanium (SiGe). The compressive stress material may apply a compressive stress to the first fin type pattern F1 to improve the mobility of carrier of the channel region.

On the other hand, when the semiconductor element to be formed is an NMOS transistor, the first source/drain region 140A or the second source/drain region 140B may include n-type impurity or the impurities for reducing or preventing diffusion of the n-type impurity. For example, the first source/drain region 140A or the second source/drain region 140B may include at least one of P, Sb, As, or a combination thereof.

In addition, when the semiconductor element to be formed is an NMOS transistor, the first source/drain region 140A or the second source/drain region 140B may include a tensile stress material. For example, when the first fin type pattern F1 is silicon (Si), the first source/drain region 140A or the second source/drain region 140B may include a material having lattice constant smaller than silicon (Si), for example, silicon carbide (SiC). The tensile stress material may apply a tensile stress to the first fin type pattern F1 to improve the mobility of carrier of the channel region.

In some embodiments, semiconductor elements of the same conductivity type may be formed in the first region I and the second region II. For example, the first source/drain region 140A and the second source/drain region 140B may include impurities of the same conductivity type (e.g., p-type impurities). However, the technical idea of the present disclosure is not limited thereto, and semiconductor elements of different conductivity types may be formed in the first region I and the second region II.

The insulating liner 150 may extend along sidewalls of the first gate electrode 124 and sidewalls of the first capping pattern 130. For example, as illustrated in FIGS. 1 and 5, the first gate electrode 124 and the first capping pattern 130 may be formed to fill the space defined by the insulating liner 150. In some embodiments, the first gate dielectric film 122 may be interposed between the first gate electrode 124 and the insulating liner 150.

Further, as illustrated in FIGS. 3 and 4, the insulating liner 150 may extend along the upper surface of the dummy fin type pattern DF. Also, in some embodiments, the insulating liner 150 may extend along the lower surface and the sidewalls of the first trench T1 of the dummy fin type pattern DF. That is, the insulating liner 150 may be formed not only on the first gate electrode 124 and the first capping pattern 130 but also on the dummy fin type pattern DF.

Also, the insulating liner 150 may also be formed on the field insulation film 110, the first source/drain region 140A, and the second source/drain region 140B. For example, as illustrated in FIG. 3, the insulating liner 150 may extend along the upper surface of the dummy fin type pattern DF, the upper surface of the field insulation film 110, the outer surface of the first source/drain region 140A, and the outer surface of the second source/drain region 140B.

The insulating liner 150 is illustrated as being a single film, but the technical idea of the present disclosure is not limited thereto, and the insulating liner 150 may be formed of multi-films.

In some embodiments, a first thickness TH1 of the insulating liner 150 on the dummy fin type pattern DF may be greater than a second thickness TH2 of the insulating liner 150 on the first source/drain region 140A or the second source/drain region 140B. In some embodiments, the insulating liner 150 may be formed on the dummy fin type pattern DF and may not be formed on the first source/drain region 140A or the second source/drain region 140B.

The insulating liner 150 may include at least one of silicon nitride (SiN), silicon oxynitride (SiON), silicon oxide (SiO$_2$), silicon oxycarbonitride (SiOCN) and combinations thereof.

An interlayer insulating film 160 may be formed on the insulating liner 150. As a result, the interlayer insulating film 160 may be formed on the substrate 100 and the field insulation film 110. Further, the interlayer insulating film 160 may surround the first gate electrode 124 and the first capping pattern 130.

Further, as illustrated in FIGS. 3 and 4, the interlayer insulating film 160 may be formed on the dummy fin type pattern DF. In some embodiments, the interlayer insulation film 160 may be formed to fill the remaining region of the first trench T1 in which the insulating liner 150 is formed. As a result, the dummy fin type pattern DF and the interlayer insulating film 160 may be spaced apart from each other by the insulating liner 150.

The interlayer insulating film 160 may include, for example, at least one of silicon oxide, silicon nitride, silicon oxynitride and low dielectric constant material having lower dielectric constant than silicon oxide. The low dielectric constant material may include, but is not limited to, for example, FOX (Flowable Oxide), TOSZ (Torene SilaZene), USG (Undoped Silica Glass), BSG (Borosilica Glass), PSG (PhosphoSilica Glass), BPSG (Boro Phospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

Figure 6:
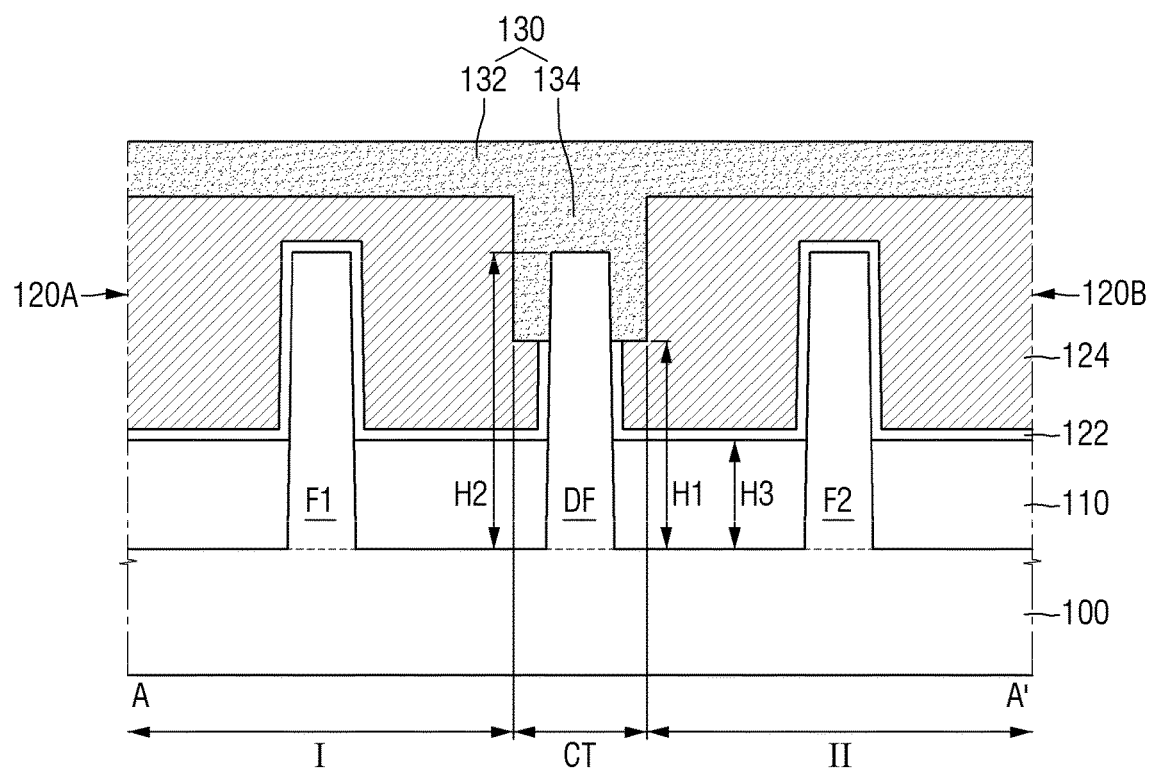
FIG. 6 is a cross-sectional view for explaining a semiconductor device according to some embodiments of the technical idea of the present inventive concepts.

FIG. 6 is a cross-sectional view for explaining a semiconductor device according to some embodiments of the technical idea of the present inventive concepts. For the sake of convenience of explanation, repeated parts of those described with reference to FIGS. 1 to 5 will be briefly described or omitted.

Referring to FIG. 6, in the semiconductor device according to some embodiments, the lower surface of the separation part 134 may be lower than or at the same height as the upper surface of the dummy fin type pattern DF.

That is, the height of the lower surface of the separation part 134 may be lower than or the same as the height of the upper surface of the dummy fin type pattern DF. Here, the "height" means the height from the upper surface of the substrate 100. For example, as illustrated, a first height H1 of the lower surface of the separation part 134 may be lower than a second height H2 of the upper surface of the dummy fin type pattern DF. As a result, the separation part 134 may come into contact with the upper surface of the dummy fin type pattern DF. Also, in some embodiments, the separation part 134 may surround the upper part of the dummy fin type pattern.

In some embodiments, the lower surface of the separation part 134 may be higher than the upper surface of the field insulation film 110. For example, as illustrated, the first height H1 of the lower surface of the separation part 134 may be lower than the second height H2 of the upper surface of the dummy fin type pattern DF, and may be higher than the third height H3 of the upper surface of the field insulation film 110. Accordingly, in some embodiments, the separation part 134 comes into contact with the dummy fin type pattern DF and may not come into contact with the field insulation film 110.

Figure 7:
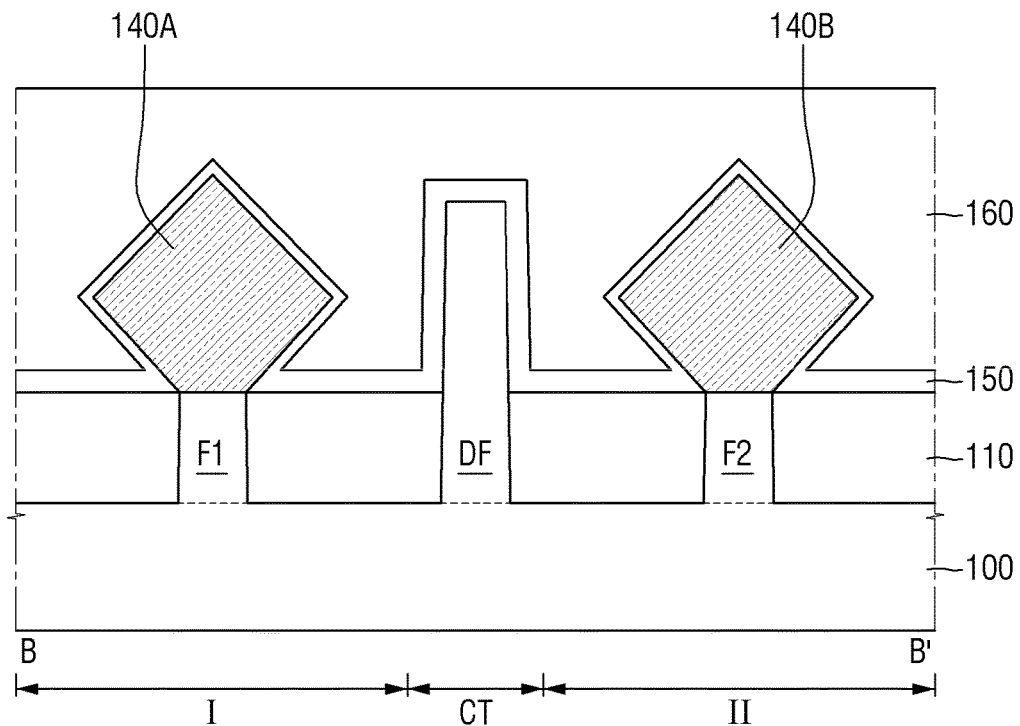
FIGS. 7 and 8 are cross-sectional views of the semiconductor device according to some embodiments of the technical idea of the present inventive concepts.
Figure 8:
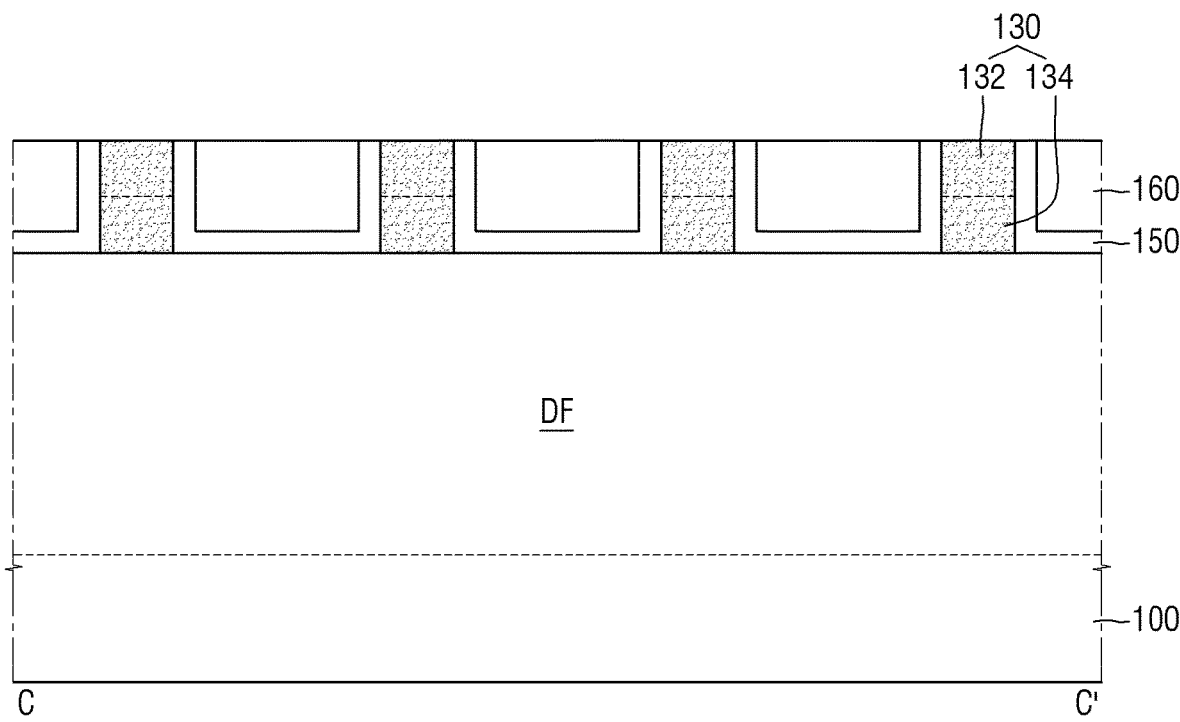

FIGS. 7 and 8 are cross-sectional views of the semiconductor device according to some embodiments of the technical idea of the present inventive concepts. For the sake of convenience of explanation, repeated parts of those described with reference to FIGS. 1 to 5 will be briefly described or omitted.

Referring to FIGS. 7 and 8, in the semiconductor device according to some embodiments, the dummy fin type pattern DF may protrude beyond the upper surface of the field insulation film 110.

For example, unlike the dummy fin type pattern DF of FIGS. 1 to 5, the dummy fin type pattern DF according to some embodiments may not include the first trench T1. As a result, the insulating liner 150 may extend not only along the upper surface of the dummy fin type pattern DF but also along the sidewall of the dummy fin type pattern DF.

In some embodiments, the thickness of the insulating liner 150 on the dummy fin type pattern DF may be greater than the second thickness of the insulating liner 150 on the first source/drain region 140A or the second source/drain region 140B. In some embodiments, the insulating liner 150 is formed on the dummy fin type pattern DF and may not be formed on the first source/drain region 140A or the second source/drain region 140B.

Figure 9:
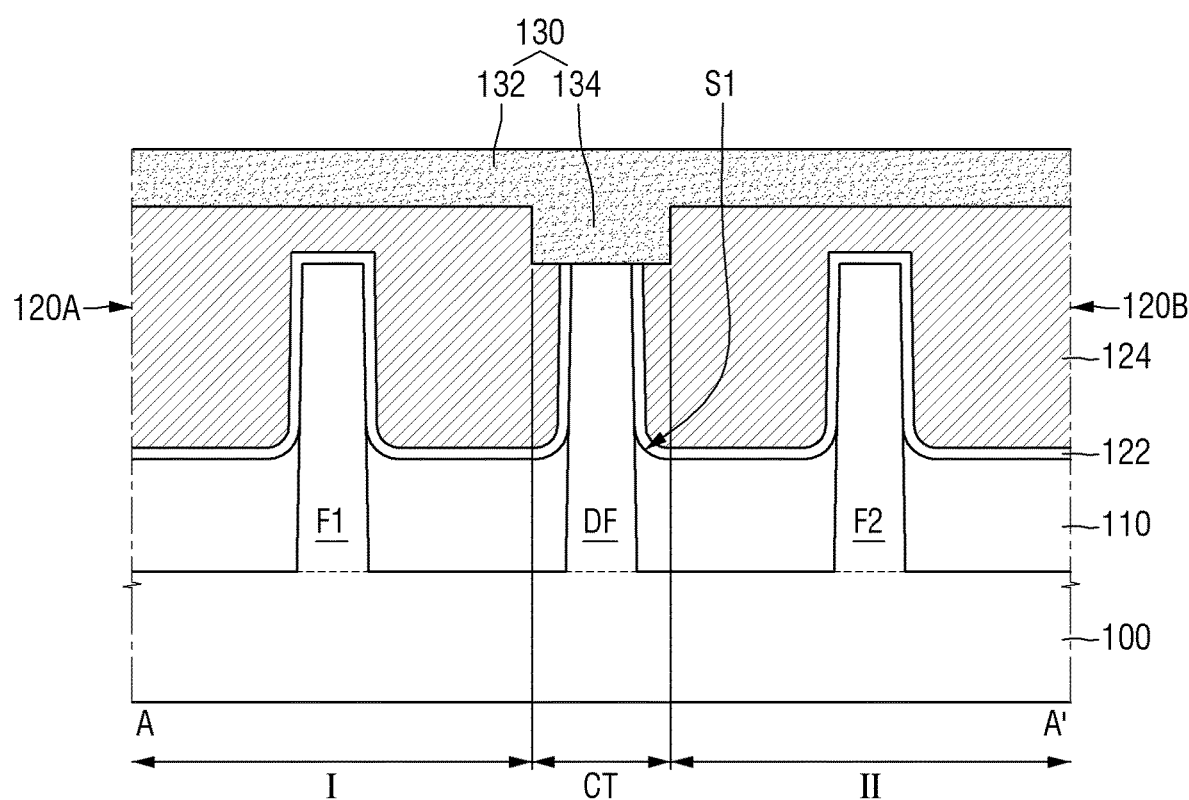
FIGS. 9 and 10 are cross-sectional views of the semiconductor device according to some embodiments of the technical idea of the present inventive concepts.
Figure 10:
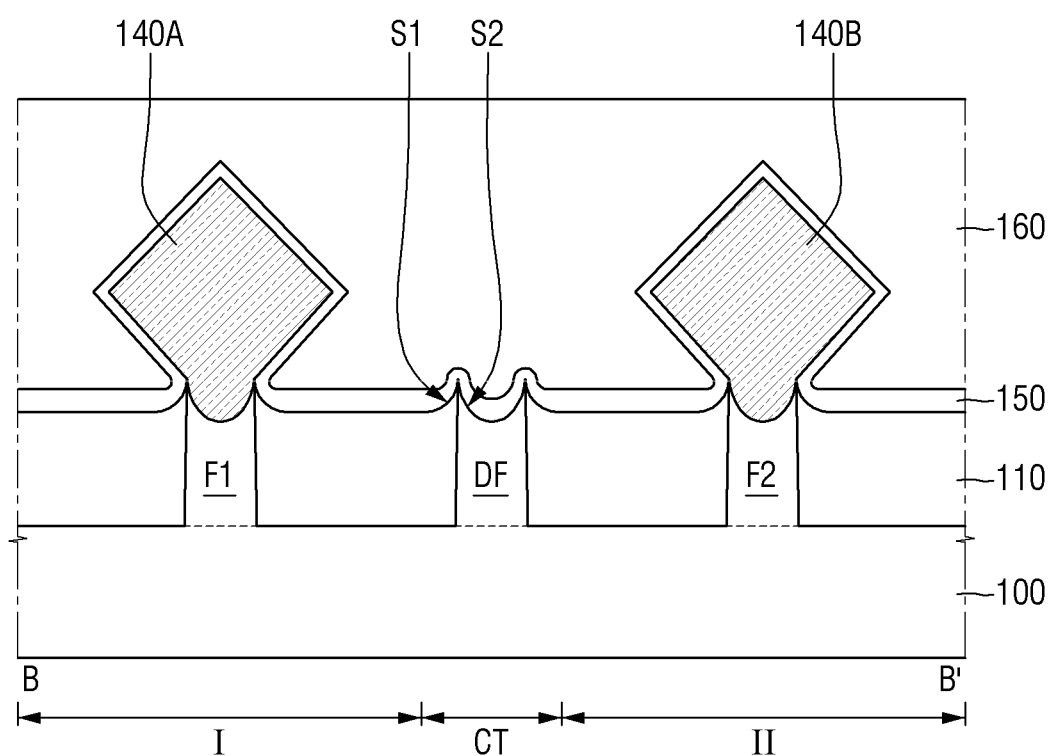

FIGS. 9 and 10 are cross-sectional views of the semiconductor device according to some embodiments of the technical idea of the present inventive concepts. For the sake of convenience of explanation, repeated parts of those described with reference to FIGS. 1 to 5 will be briefly described or omitted.

Referring to FIGS. 9 and 10, in the semiconductor device according to some embodiments, the field insulation film 110 and the dummy fin type pattern DF may include concave upper surfaces.

For example, the upper surface of the field insulation film 110 adjacent to the fin type patterns (the first fin type pattern F1, the dummy fin type pattern DF and the second fin type pattern F2) may upwardly concave. For example, the first upper surface S1 of the field insulation film 110 adjacent to the dummy fin type pattern DF may have a shape that is upwardly concave.

Further, the dummy fin type pattern DF may include a concave upper surface. For example, the second upper surface S2 of the dummy fin type pattern DF may have a shape that is upwardly concave. The shape of the upper surface of such a dummy fin type pattern DF may be attributed to the characteristics of the etching process for forming the first trench T1 of FIG. 4. For example, the etching process for forming the first trench T1 may make the upper surface of the dummy fin type pattern DF concave.

In some embodiments, the insulating liner 150 may extend along a profile of the upper surface of the field insulation film 110 including the first upper surface S1, and a profile of the upper surface of the dummy fin type pattern DF including the second upper surface S2.

Figure 11:
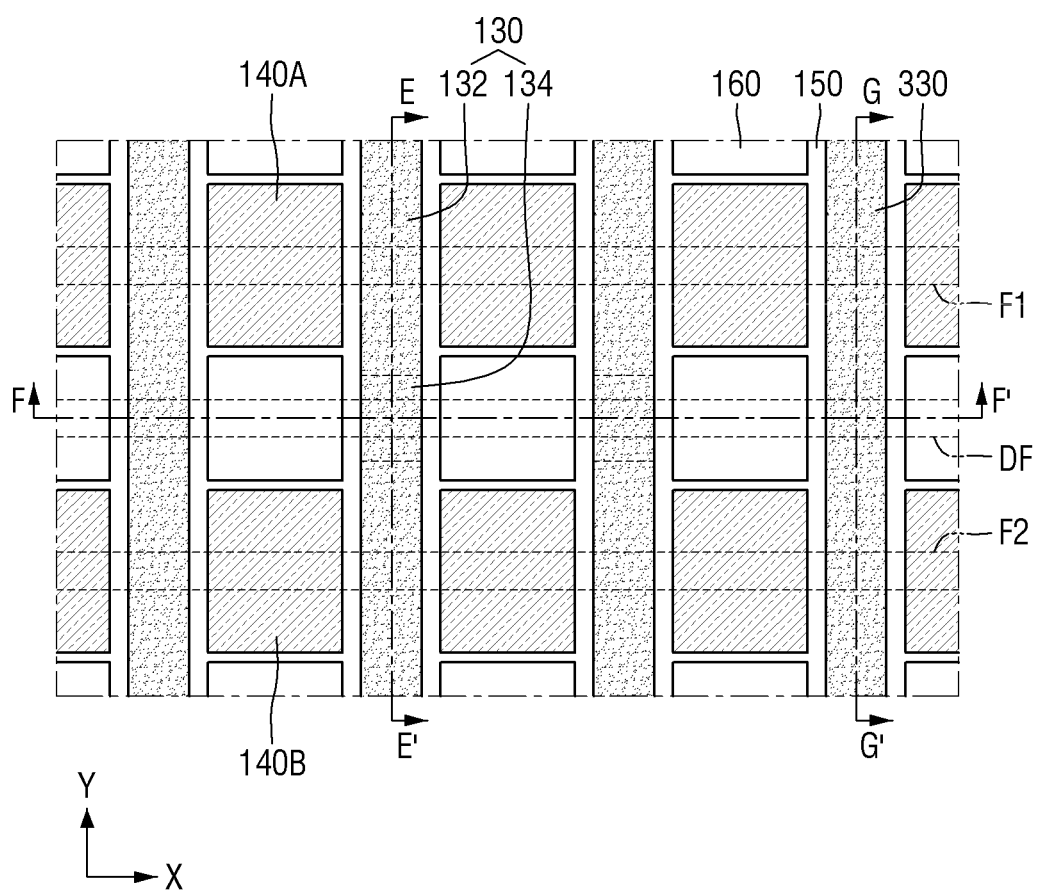
FIG. 11 is a layout diagram of the semiconductor device according to some embodiments of the technical idea of the present inventive concepts.
Figure 12:
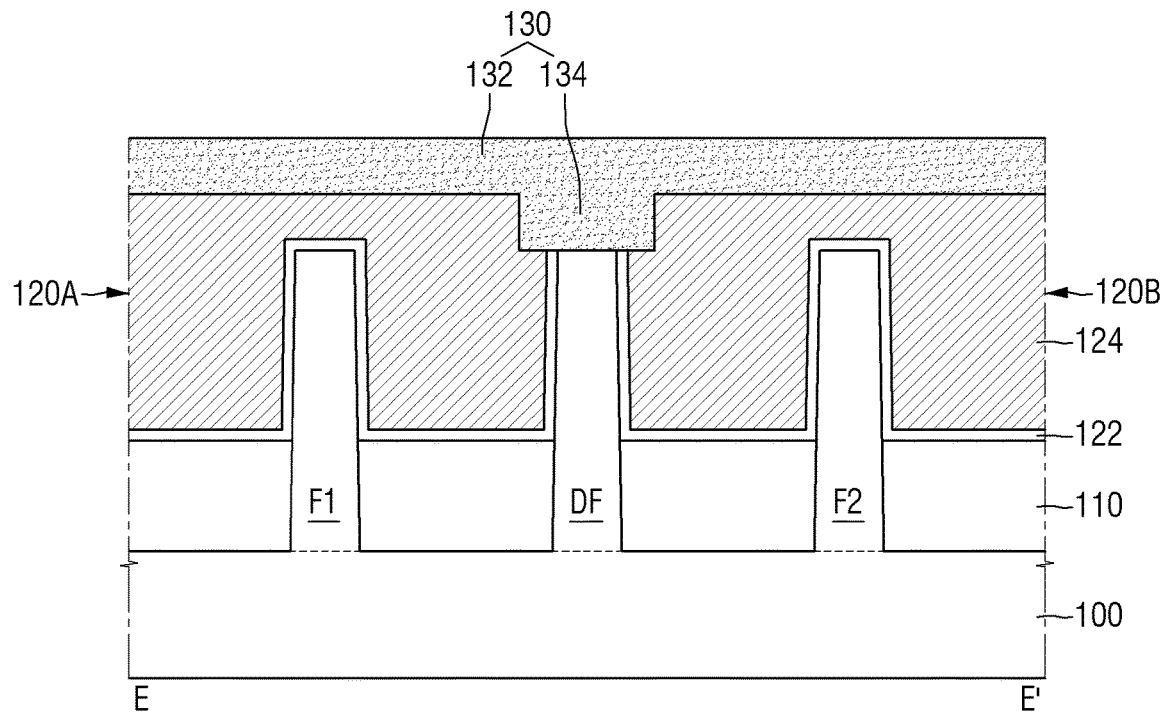
FIG. 12 is a cross-sectional view taken along line E-E' of FIG. 11.
Figure 13:
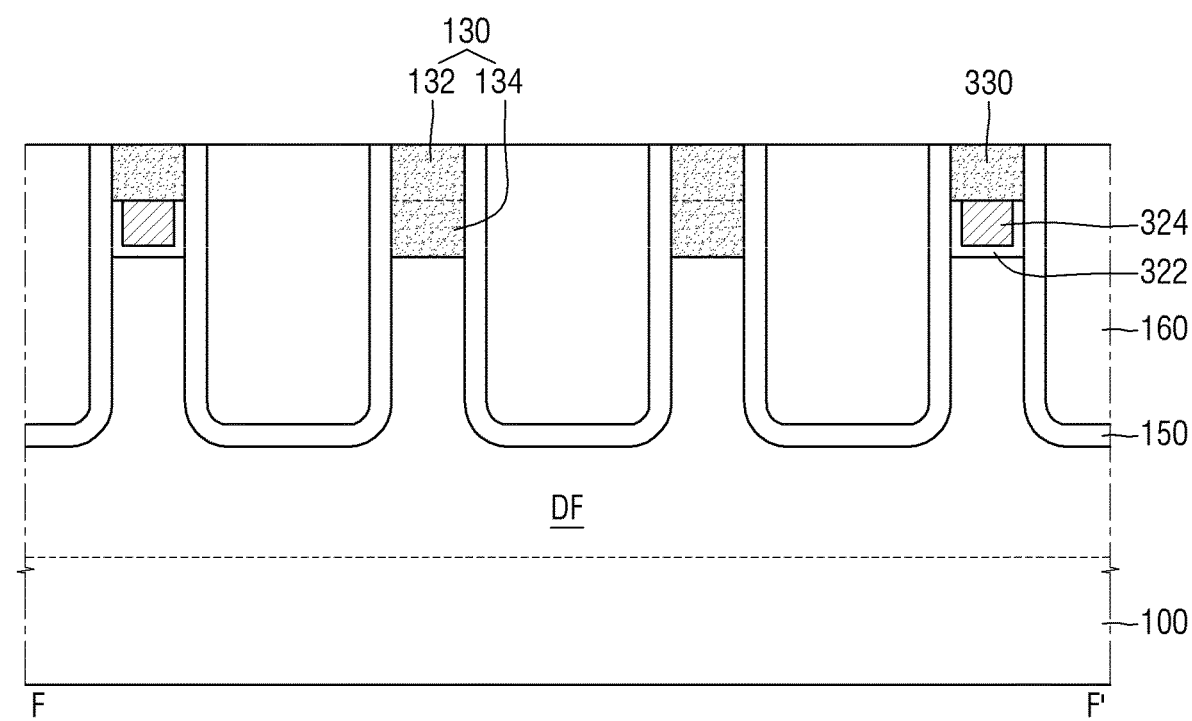
FIG. 13 is a cross-sectional view taken along line F-F' of FIG. 11.
Figure 14:
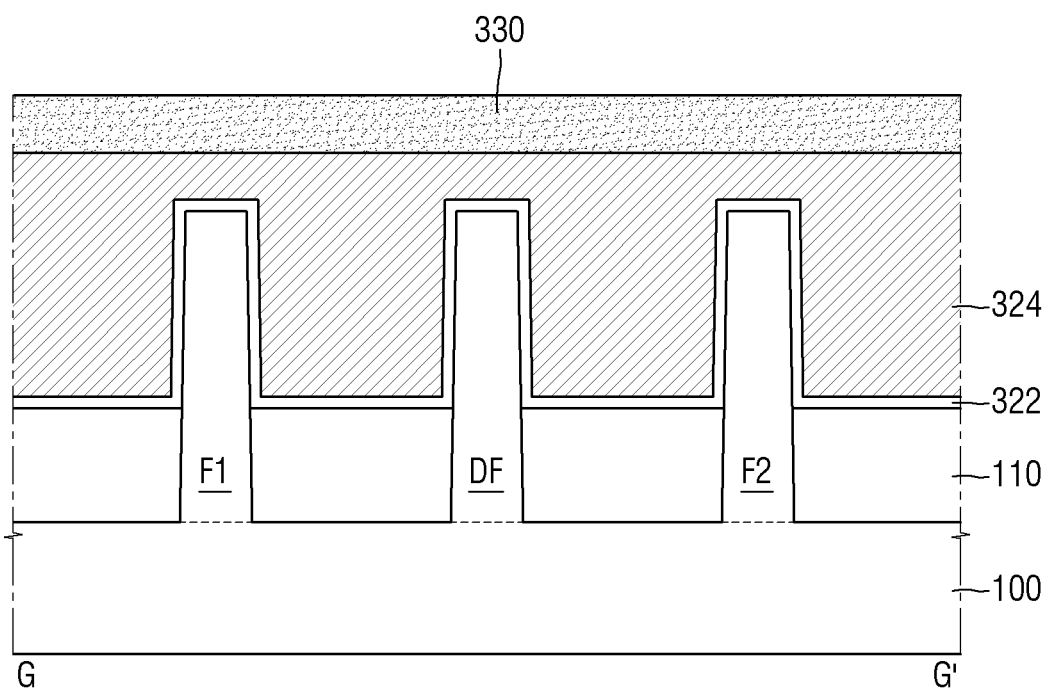
FIG. 14 is a cross-sectional view taken along the line G-G' of FIG. 11.

FIG. 11 is a layout diagram of the semiconductor device according to some embodiments of the technical idea of the present inventive concepts. FIG. 12 is a cross-sectional view taken along line E-E' of FIG. 11. FIG. 13 is a cross-sectional view taken along line F-F' of FIG. 11. FIG. 14 is a cross-sectional view taken along the line G-G' of FIG. 11. For the sake of convenience of explanation, repeated parts of those described with reference to FIGS. 1 to 5 will be briefly described or omitted.

Referring to FIGS. 11 to 14, the semiconductor device according to some embodiments further includes a second gate dielectric film 322, a second gate electrode 324, and/or a second capping pattern 330.

The second gate dielectric film 322, the second gate electrode 324, and the second capping pattern 330 may be formed on the first fin type pattern F1, the dummy fin type pattern DF and the second fin type pattern F2. Further, the second gate electrode 324 may intersect with the first fin type pattern F1, the dummy fin type pattern DF and the second fin type pattern F2. The second gate electrode 324 may be spaced apart from the first gate electrode 124 and extend in the second direction Y.

Similarly to the first gate electrode 124, the second gate electrode 324 may include a conductive material. In some embodiments, the second gate electrode 324 may be formed at the same level as the first gate electrode 124. In the present specification, "the same level" means that the gate electrodes are formed by the same fabricating process.

The second gate dielectric film 322 may be interposed between the substrate 100 and the second gate electrode 324. For example, as illustrated in FIG. 14, the second gate dielectric film 322 may extend along a profile of the upper surface of the field insulation film 110, and profiles of the fin type patterns (e.g., the first fin type pattern F1, the dummy fin type pattern DF and the second fin type pattern F2) exposed by the field insulation film 110. Unlike the first gate dielectric film 122, the second gate dielectric film 322 may also be formed on the upper surface of the dummy fin type pattern DF.

Like the first gate dielectric film 122, the second gate dielectric film 322 may include at least one of silicon oxide ($SiO_2$), silicon oxynitride (SiON), silicon nitride (SiN), or a high dielectric constant material having a higher dielectric constant than silicon oxide ($SiO_2$). In some embodiments, the second gate dielectric film 322 may be formed at the same level as the first gate dielectric film 122.

The second capping pattern 330 may be formed on the second gate electrode 324. In addition, the second capping pattern 330 may extend along the second direction Y. Unlike the first capping pattern 130, the second capping pattern 330 may not be in contact with the dummy fin type pattern DF. As a result, the second capping pattern 330 may not separate the second gate electrode 324. That is, unlike the first gate electrode 124, the second gate electrode 324 may not be electrically separated by the dummy fin type pattern DF and the second capping pattern 330.

In FIGS. 11 and 13, two second gate electrodes 324 are illustrated as being disposed with two first capping patterns 130 interposed therebetween, but this is for convenience of explanation, and the technical idea of the present disclosure is not limited thereto. Unlike the configurations illustrated in FIGS. 11 and 13, the first gate electrode 124 and the second gate electrode 324 may be arranged in various ways.

Figure 15:
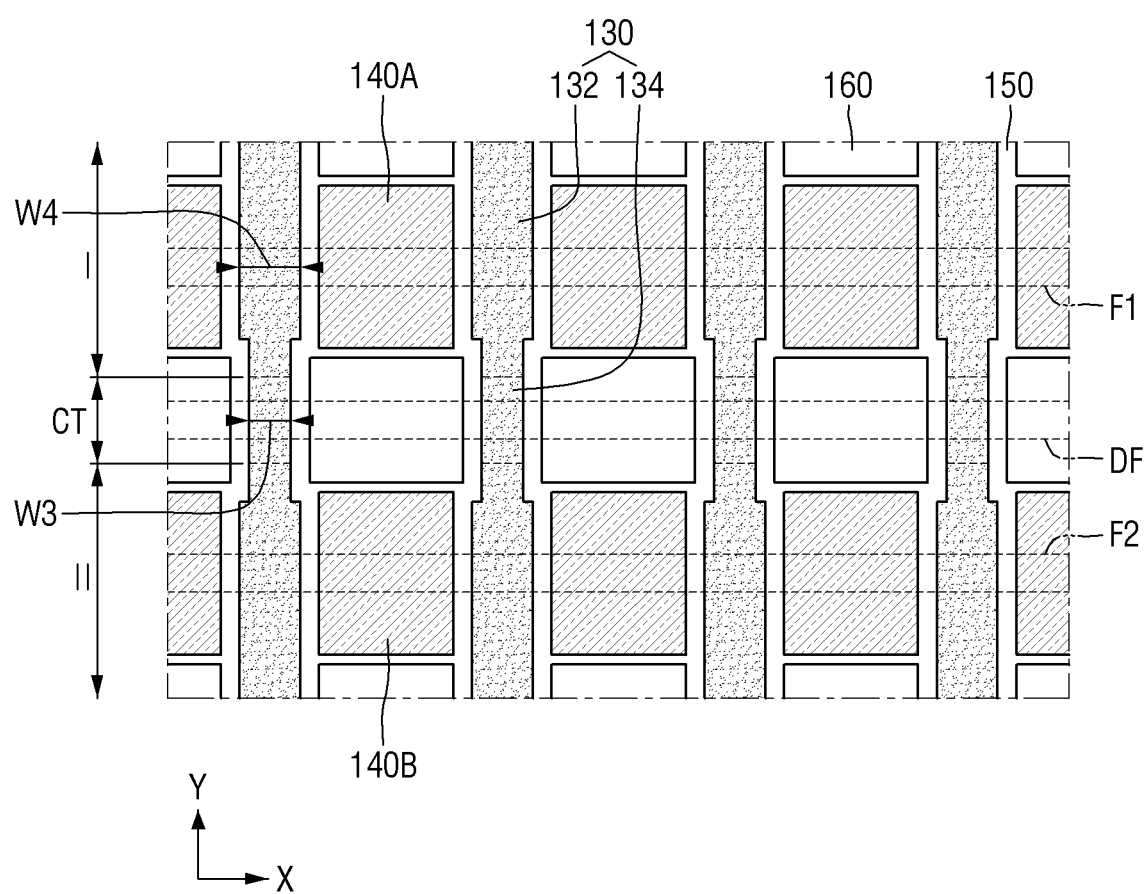
FIG. 15 is a layout diagram of the semiconductor device according to some embodiments of the technical idea of the present inventive concepts.
Figure 16:
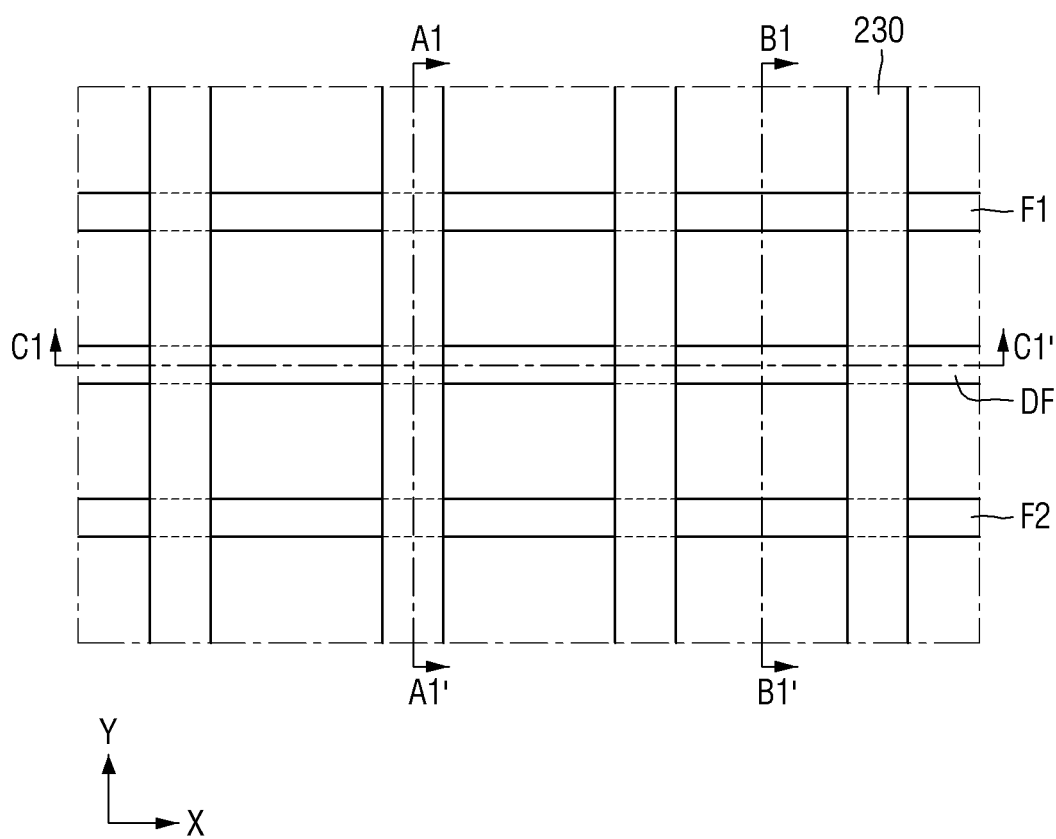
FIGS. 16 to 46 are intermediate step diagrams for explaining the method for fabricating the semiconductor device according to some embodiments of the technical idea of the present inventive concepts.

FIG. 15 is a layout diagram of the semiconductor device according to some embodiments of the technical idea of the present disclosure. For the sake of convenience of explanation, repeated parts of those described with reference to FIGS. 1 to 5 will be briefly described or omitted.

Referring to FIG. 15, in the semiconductor device according to some embodiments, the width of the first capping pattern 130 of the separation region CT may be smaller than the width of the first capping pattern 130 of the first region I or the second region II.

Here, the "width" means the width in the first direction X. For example, a third width W3 of the first capping pattern 130 on the dummy fin type pattern DF may be smaller than a fourth width W4 of the first capping pattern 130 on the first fin type pattern F1. The shape of the first capping pattern 130 as described above may be attributed to the characteristics of the etching process for forming the first trench T1 of FIG. 4. This will be described later in the description of FIGS. 24 to 26.

Hereinafter, a method for fabricating a semiconductor device according to some embodiments of the technical idea of the present inventive concepts will be described with reference to FIGS. 1 to 5 and 16 to 46.

FIGS. 16 to 46 are intermediate step diagrams for explaining the method for fabricating the semiconductor device according to some embodiments of the technical idea of the present inventive concepts. For the sake of convenience of explanation, repeated parts of those described with reference to FIGS. 1 to 15 will be briefly described or omitted.

Figure 17:
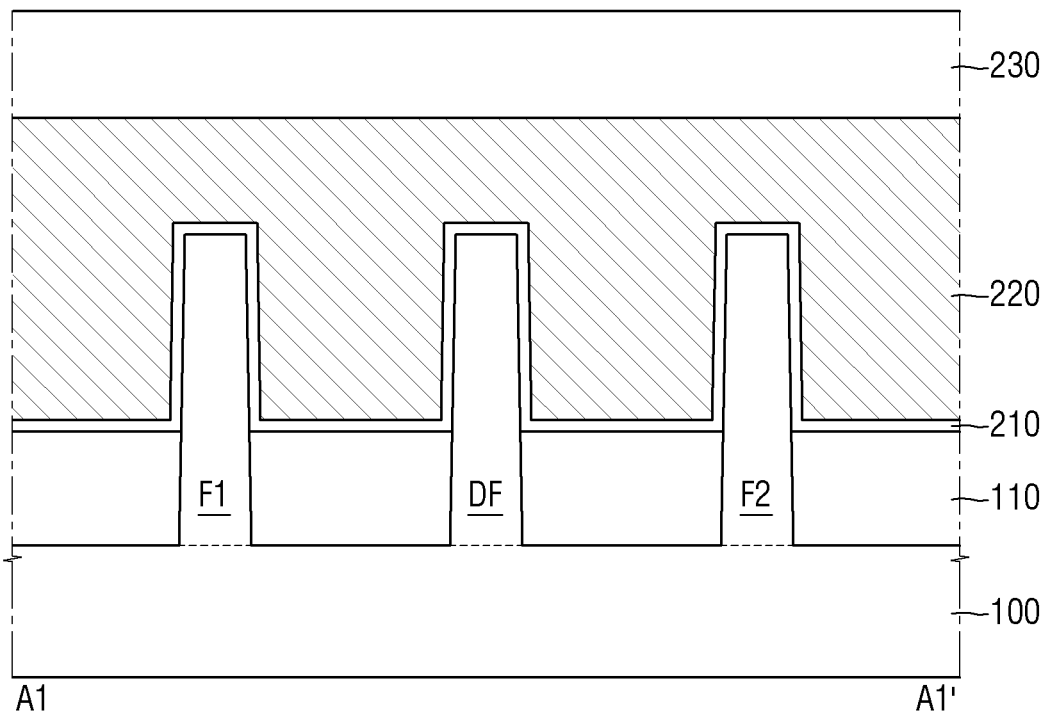
Figure 18:
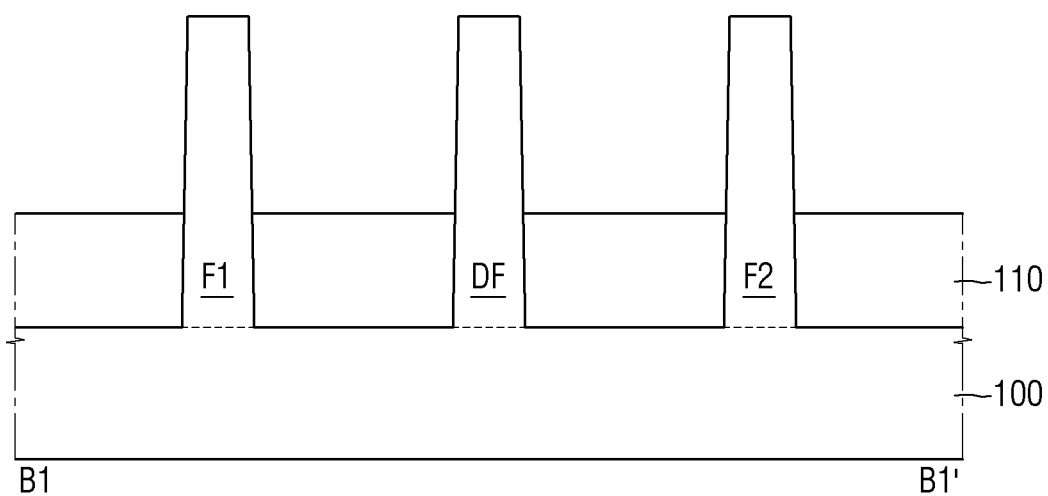
Figure 19:
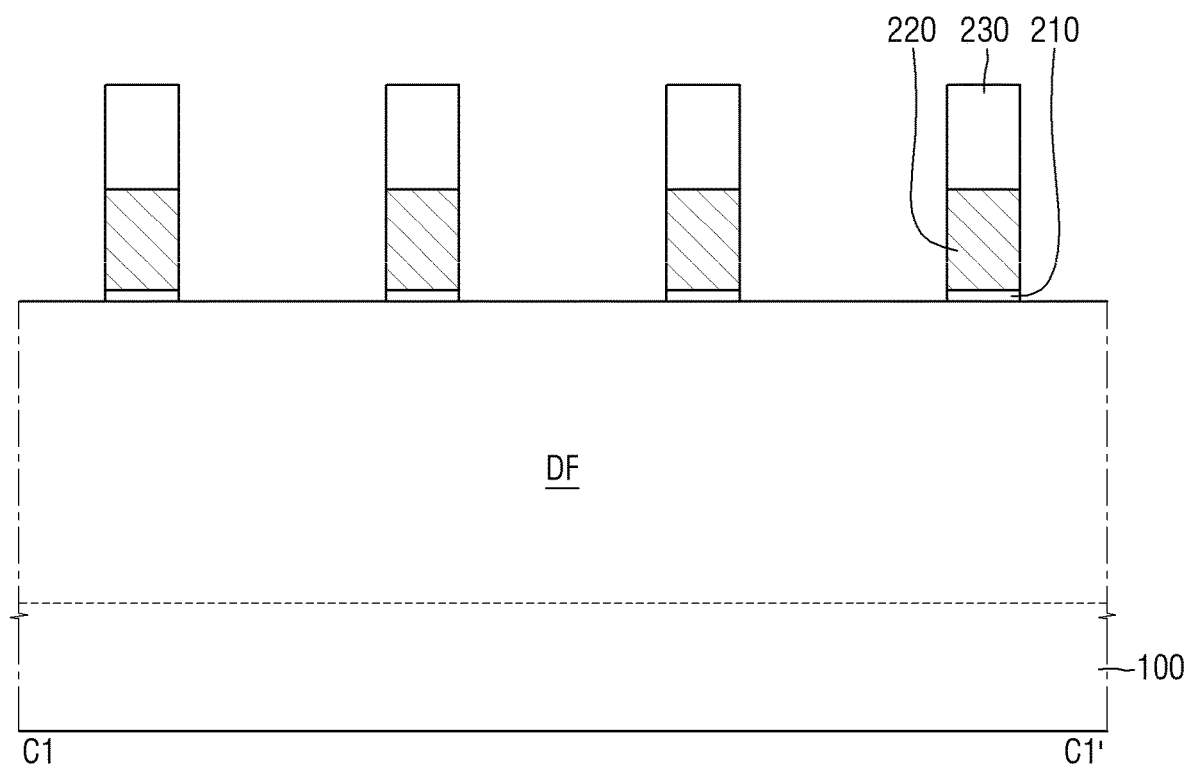
Figure 20:
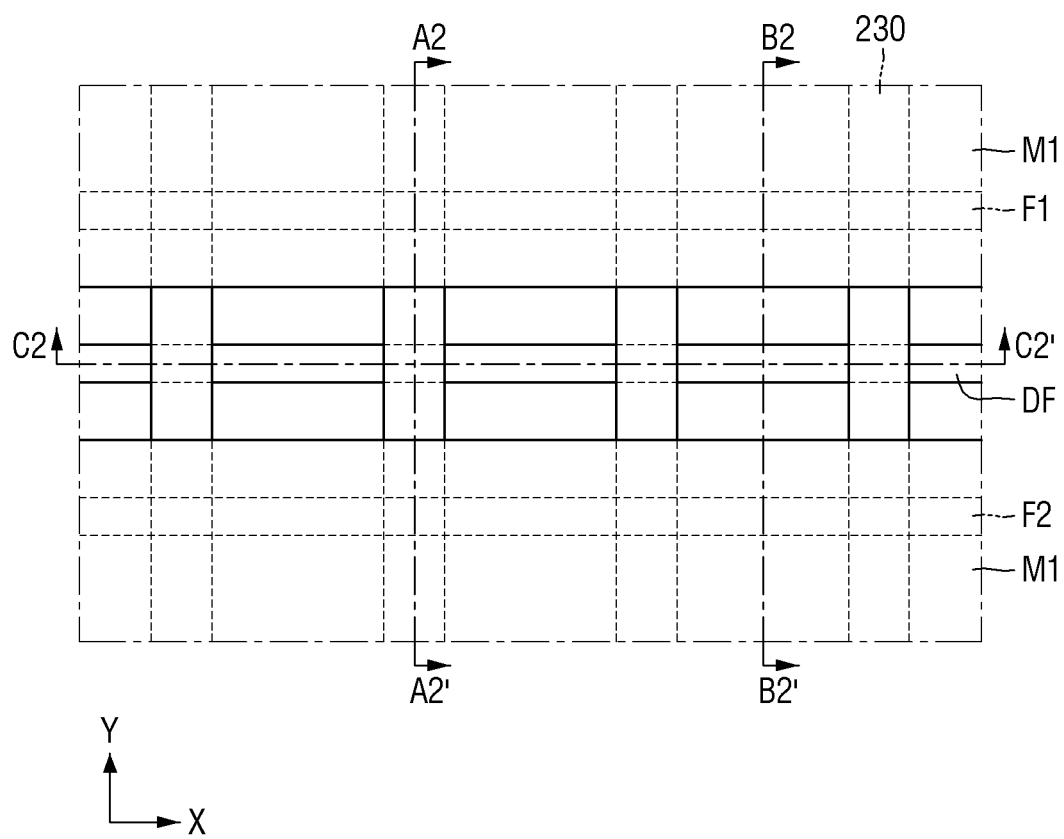

Referring to FIGS. 16 to 19, a dummy gate dielectric film 210 and a dummy gate electrode 220 are formed on the substrate 100. For reference, FIG. 17 is a cross-sectional view cut along the line A1-A1 of FIG. 16. FIG. 18 is a cross-sectional view taken along the line B1-B1 of FIG. 16. FIG. 19 is a cross-sectional view taken along line C1-C1 of FIG. 16.

The substrate 100 may include a first fin type pattern F1, a dummy fin type pattern DF and a second fin type pattern F2. The first fin type pattern F1, the dummy fin type pattern DF, and the second fin type pattern F2 may protrude from the substrate 100 and extend in the first direction X, respectively. The first fin type pattern F1, the dummy fin type pattern DF, and the second fin type pattern F2 may be a part of the substrate 100, and may include an epitaxial layer grown from the substrate 100.

Subsequently, the field insulation film 110 is formed on the substrate 100.

The field insulation film 110 may surround a part of the first fin type pattern F1, a part of the dummy fin type pattern DF and a part of the second fin type pattern F2.

Subsequently, a dummy gate dielectric film 210 and a dummy gate electrode 220 are formed on the substrate 100.

For example, an insulating film and a conductive film are sequentially formed on the substrate 100, and the insulating film and the conductive film may be patterned, using a dummy capping pattern 230 extending in the second direction Y. As a result, the dummy gate dielectric film 210 and the dummy gate electrode 220 extending in the second direction Y may be formed on the substrate 100.

Figure 21:
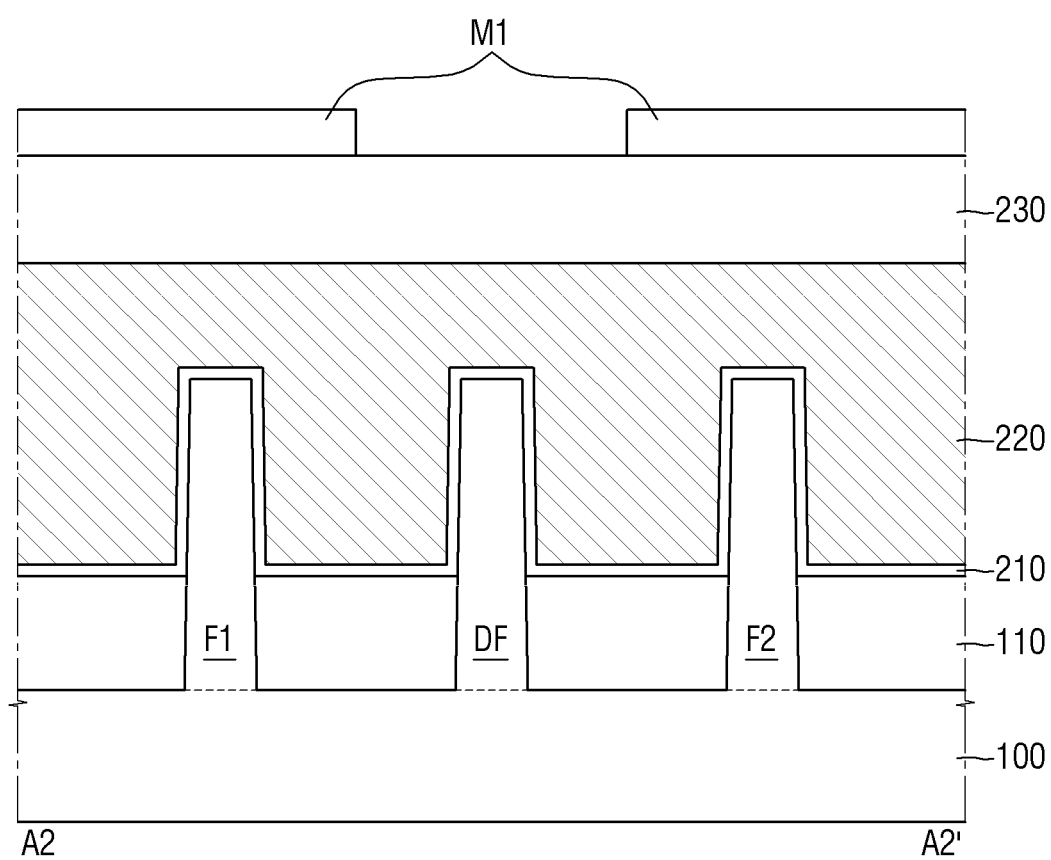
Figure 22:
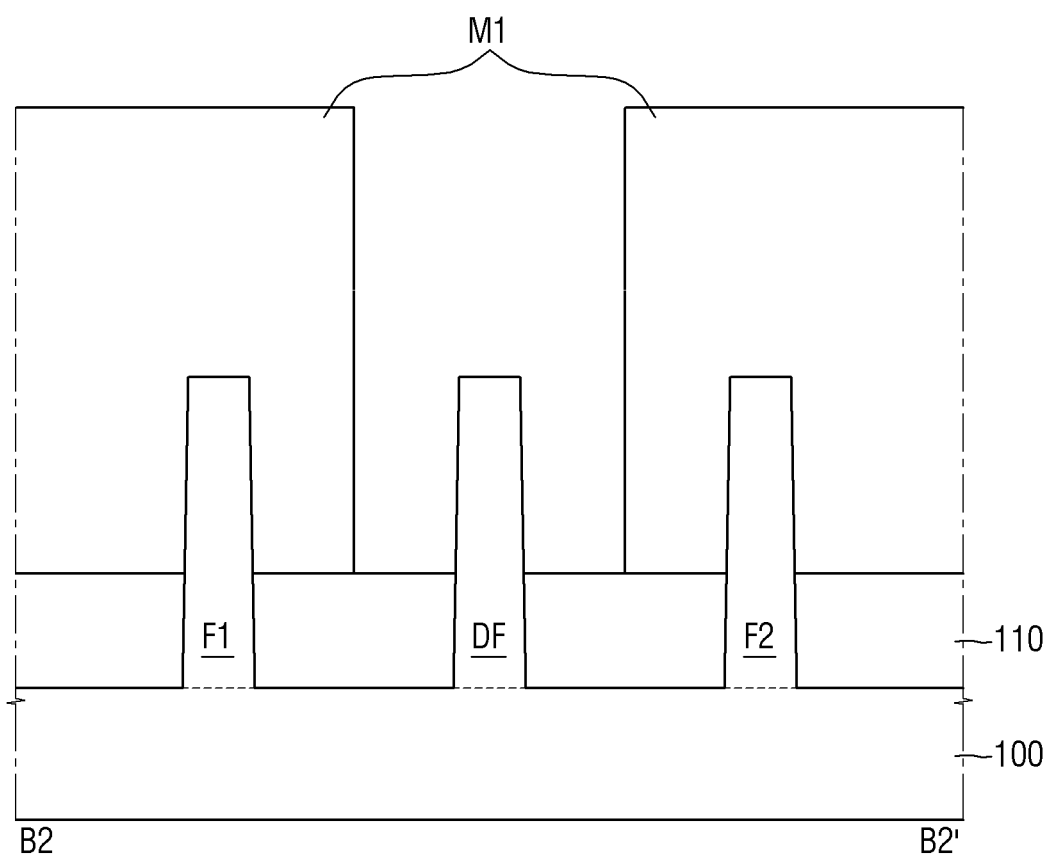
Figure 23:
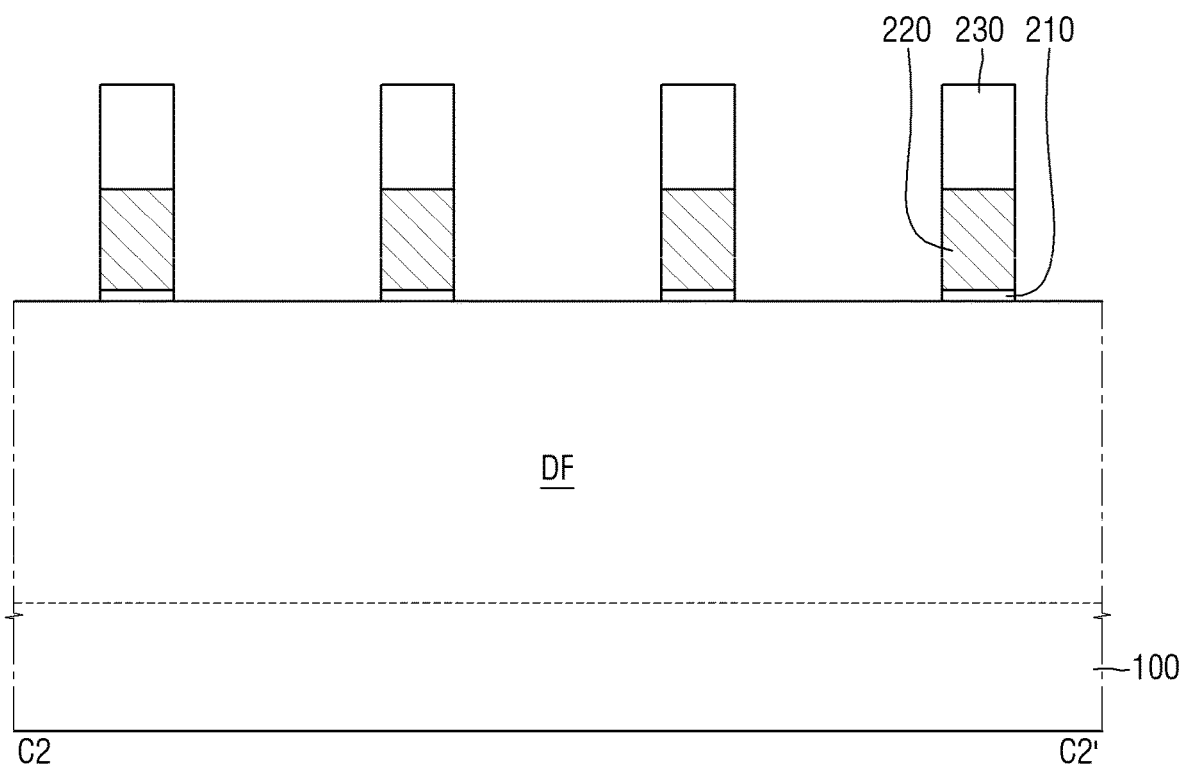

Referring to FIGS. 20 to 23, a first mask pattern M1 for exposing the dummy fin type pattern DF is formed. For reference, FIG. 21 is a cross-sectional view taken along line A2-A2 of FIG. 20. FIG. 22 is a cross-sectional view taken along line B2-B2 of FIG. 20. FIG. 23 is a cross-sectional view taken along line C2-C2 of FIG. 20.

For example, a first mask pattern M1 which overlaps the first fin type pattern F1 and the second fin type pattern F2 and does not overlap the dummy fin type pattern DF may be formed. As a result, the dummy fin type pattern DF may be exposed. Further, the dummy gate dielectric film 210, the dummy gate electrode 220 and the dummy capping pattern 230 on the dummy fin type pattern DF may be exposed.

The first mask pattern M1 may include, but is not limited to, for example, a photoresist.

Figure 24:
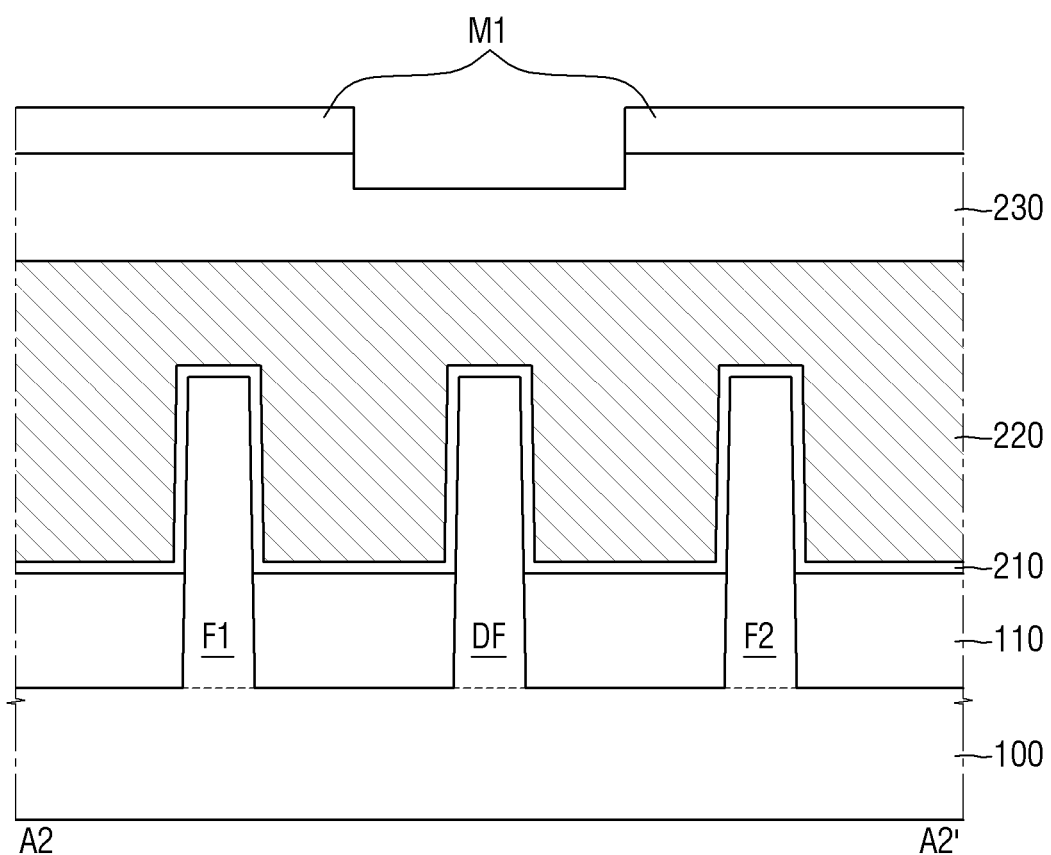
Figure 25:
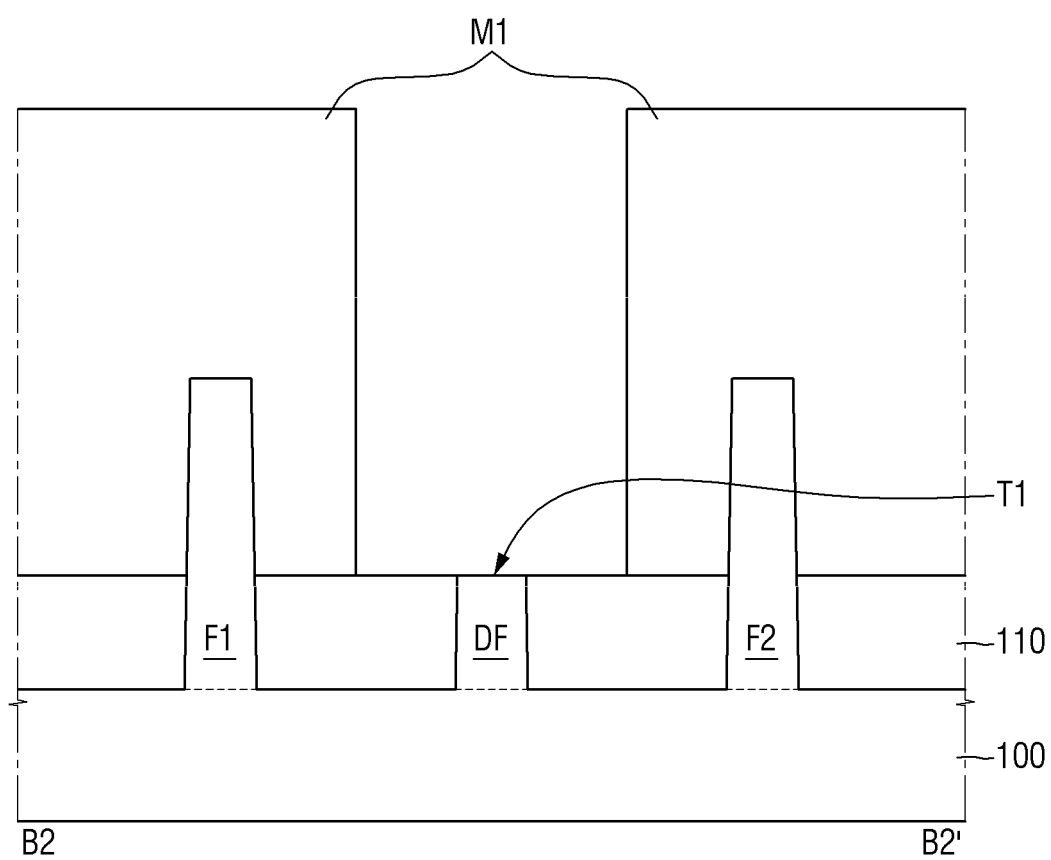
Figure 26:
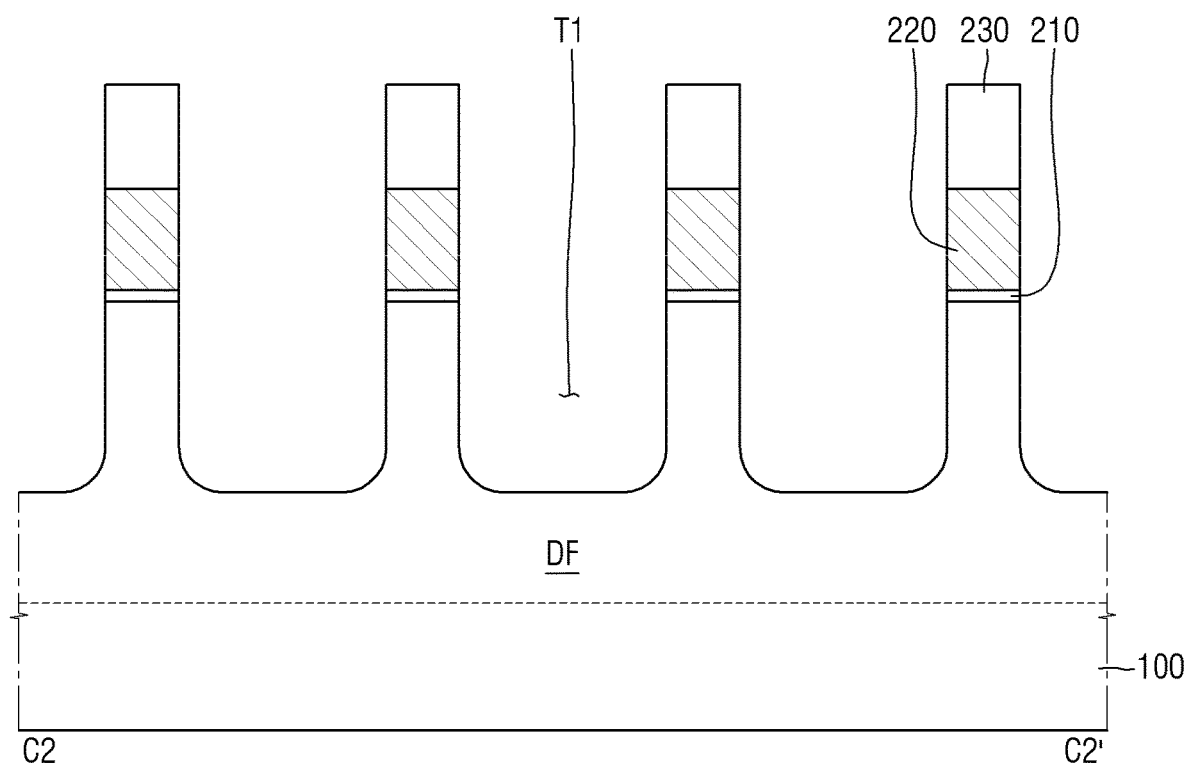

Referring to FIGS. 24 to 26, a part of the dummy fin type pattern DF is etched, using the dummy capping pattern 230 and the first mask pattern M1 as an etching mask.

As a result, the first trench T1 may be formed inside the dummy fin type pattern DF on both sides of the dummy gate electrode 220. In FIG. 25, the lower surface of the first trench T1 is illustrated to have the same height as the upper surface of the field insulation film 110, but the technical idea of the present disclosure is not limited thereto. For example, in FIG. 25, the lower surface of the first trench T1 may be higher than the upper surface of the field insulation film 110.

After the first trench T1 is formed, the first mask pattern M1 may be removed.

In some embodiments, a part of the dummy capping pattern 230 may be etched by an etching process that etches a part of the dummy fin type pattern DF. For example, as illustrated in FIG. 24, a part of the dummy capping pattern 230 exposed by the first mask pattern M1 may be etched.

In some embodiments, the process of etching a part of the dummy fin type pattern DF may be omitted. For example, the dummy fin type pattern DF may not include the first trench T1. As a result, the dummy fin type pattern DF of FIGS. 7 and 8 may be formed.

In some embodiments, the widths of the dummy gate electrode 220 and the dummy capping pattern 230 may be reduced by an etching step of etching a part of the dummy fin type pattern DF. Here, the "width" means the width in the first direction X. As will be described later with reference to FIGS. 38 to 40, the dummy gate electrode 220 may be replaced with the first gate electrode 124. Similarly, as will be described later, the dummy capping pattern 230 may be replaced with the first capping pattern 130. Therefore, the first gate electrode 124 and the first fin type pattern F1 of FIG. 15 may be formed.

Figure 27:
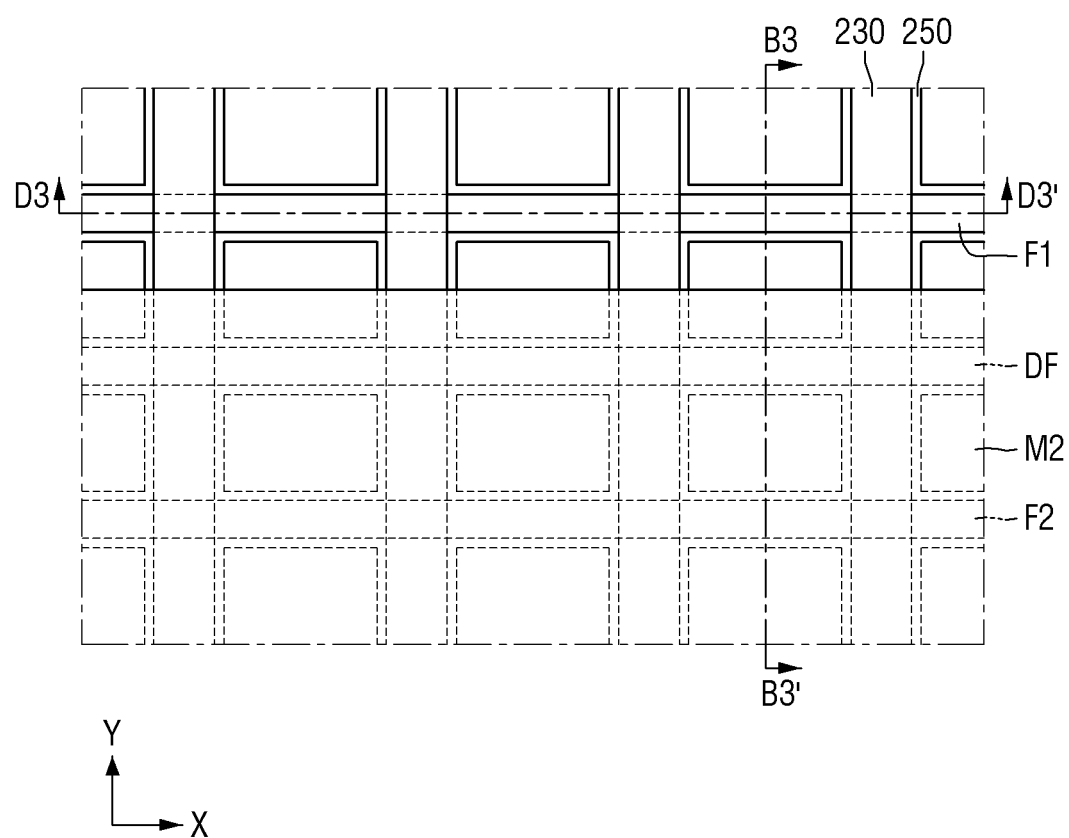
Figure 28:
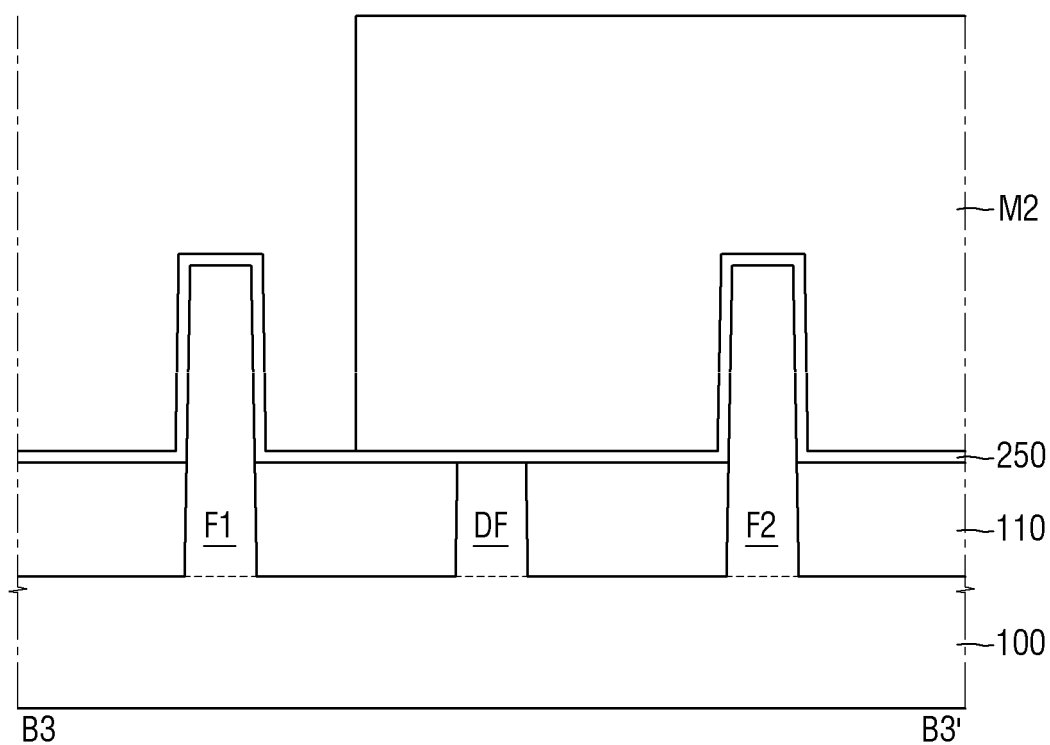
Figure 29:
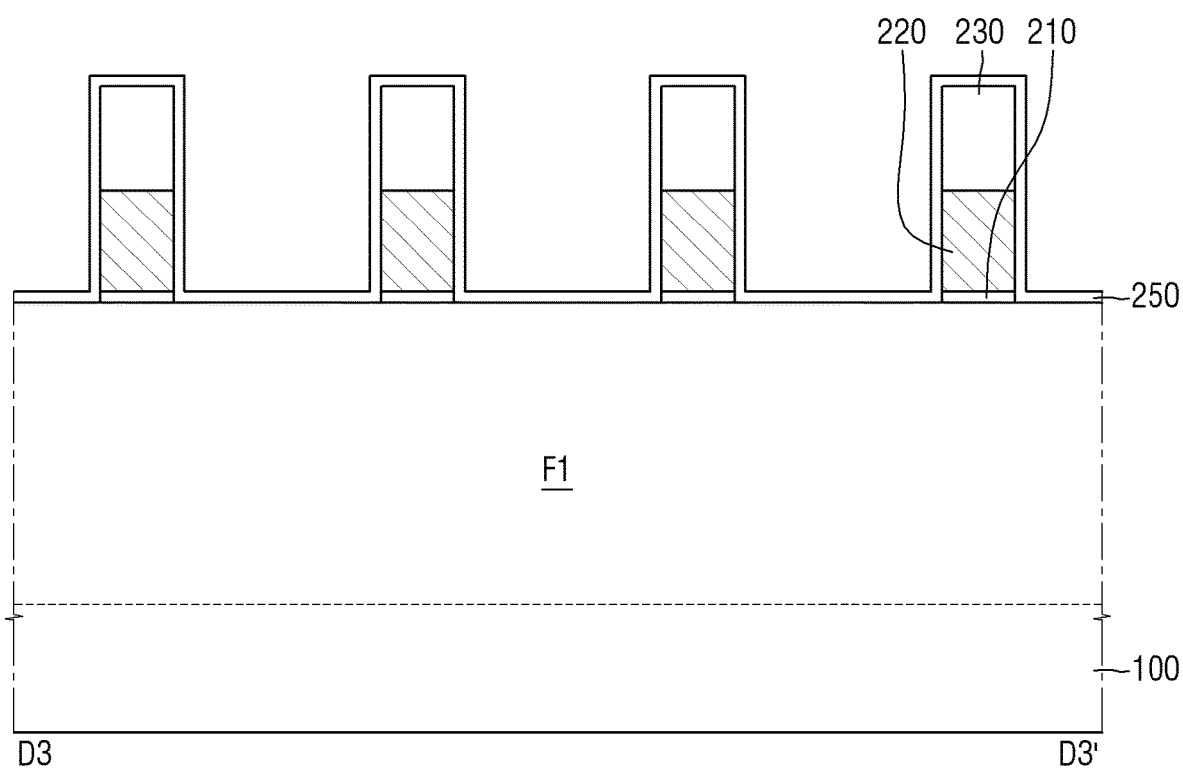

Referring to FIGS. 27 to 29, a pre-insulating liner 250 is formed on the resultant of FIGS. 24 to 26. For reference, FIG. 28 is a cross-sectional view taken along line B3-B3 in FIG. 27. FIG. 29 is a cross-sectional view taken along line D3-D3 of FIG. 27.

The pre-insulating liner 250 may extend along the sidewalls of the dummy gate electrode 220, and the sidewalls and the upper surface of the dummy capping pattern 230. Further, the pre-insulating liner 250 may be formed on the field insulation film 110, the first fin type pattern F1, the dummy fin type pattern DF, and the second fin type pattern F2.

The pre-insulating liner 250 may include at least one of, for example, silicon nitride (SiN), silicon oxynitride (SiON), silicon oxide (SiO$_2$), silicon oxycarbonitride (SiOCN), and combinations thereof.

Subsequently, a second mask pattern M2 for exposing the pre-insulating liner 250 on the first fin type pattern F1 is formed.

For example, a second mask pattern M2 which overlaps the dummy fin type pattern DF and the second fin type pattern F2 and does not overlap the first fin type pattern F1 may be formed. As a result, the pre-insulating liner 250 on the first fin type pattern F1 may be exposed.

The second mask pattern M2 may include, but is not limited to, for example, a photoresist.

Figure 30:
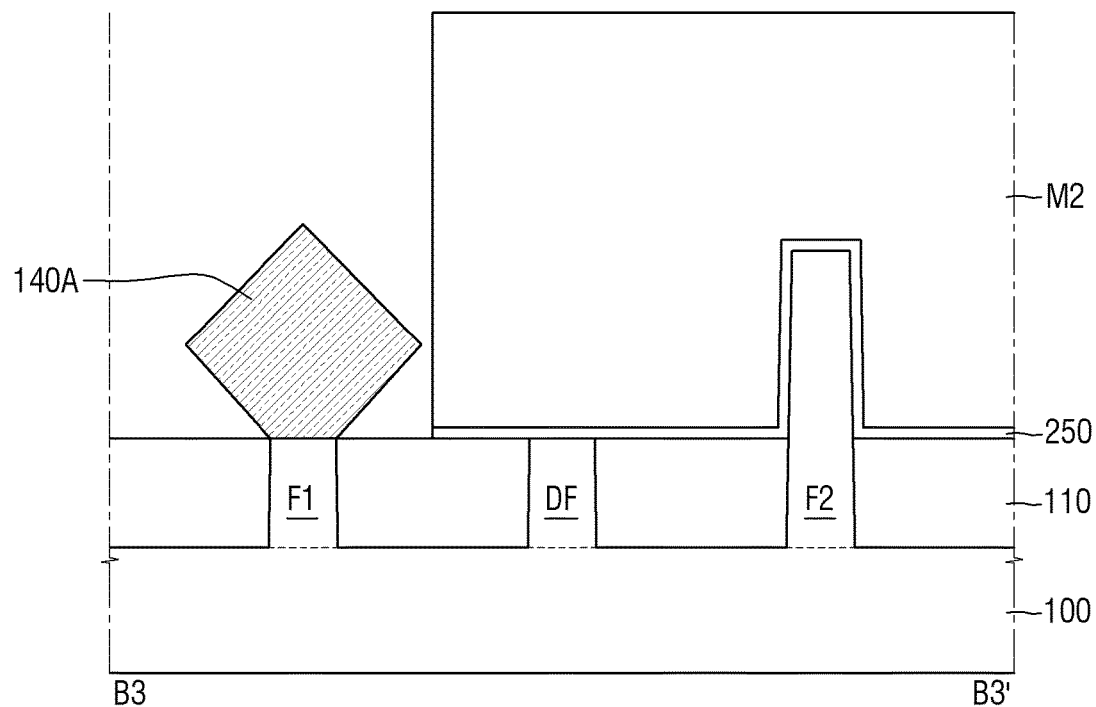
Figure 31:
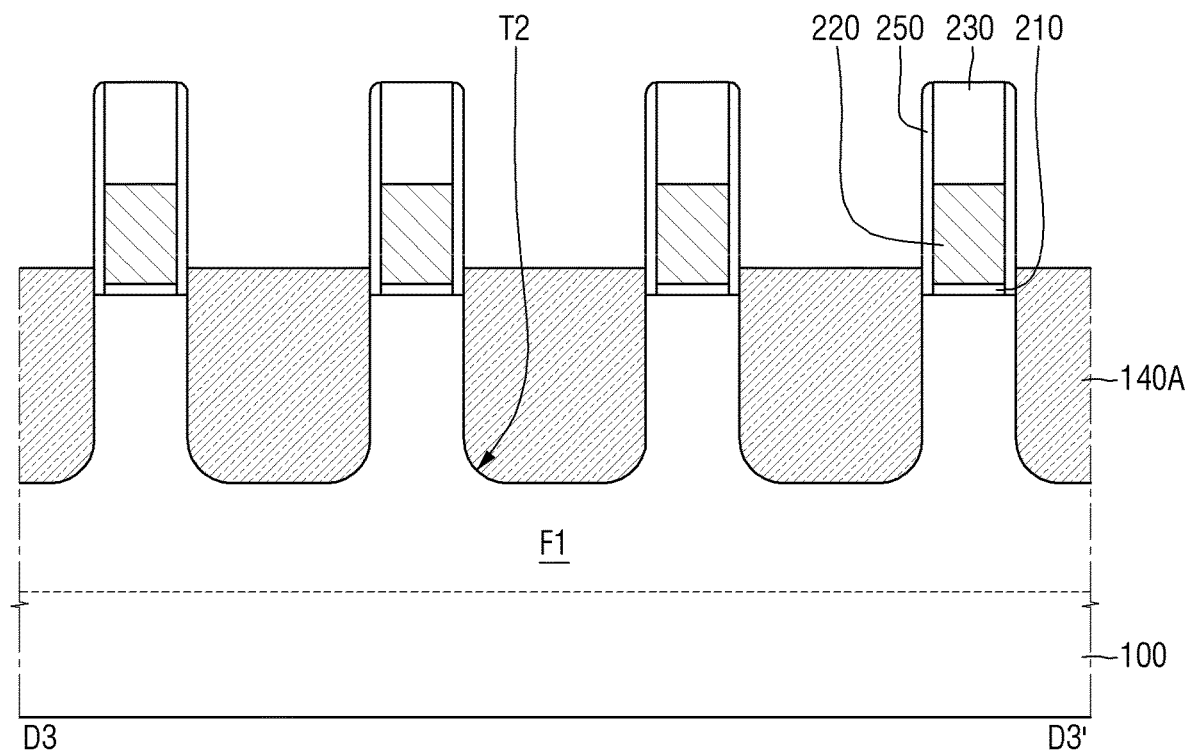

Referring to FIGS. 30 and 31, a part of the first fin type pattern F1 is etched, using the first mask pattern M1 as an etching mask.

As a result, the second trench T2 may be formed in the dummy fin type pattern DF on both sides of the dummy gate electrode 220. In FIG. 30, the lower surface of the second trench T2 is illustrated to have the same height as the upper surface of the field insulation film 110, but the technical idea of the present disclosure is limited thereto. For example, in FIG. 30, the lower surface of the second trench T2 may be higher than the upper surface of the field insulation film 110.

In some embodiments, the pre-insulating liner 250 on the sidewall of the dummy gate electrode 220 and the sidewall of the dummy capping pattern 230 may be used as an etching mask that etches a part of the first fin type pattern F1.

Subsequently, a first source/drain region 140A is formed on the first fin type pattern F1.

The first source/drain region 140A may be formed in the first fin type pattern F1 on both sides of the first gate electrode 124. For example, the first source/drain region 140A may be formed on the exposed first fin type pattern F1 by the epitaxial growth method. As a result, the first source/drain region 140A that fills the second trench T2 may be formed.

After the first source/drain region 140A is formed, the second mask pattern M2 may be removed.

Figure 32:
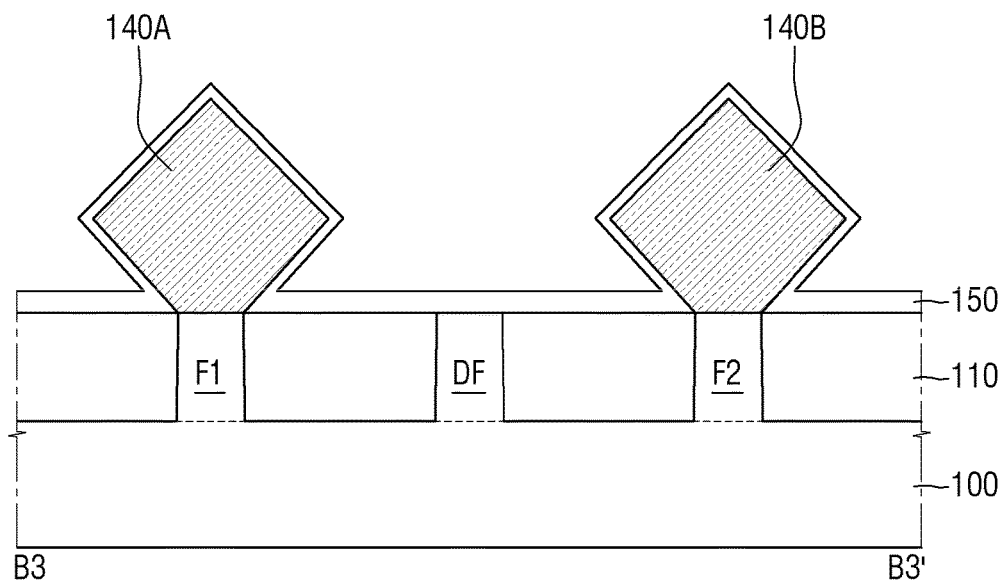
Figure 33:
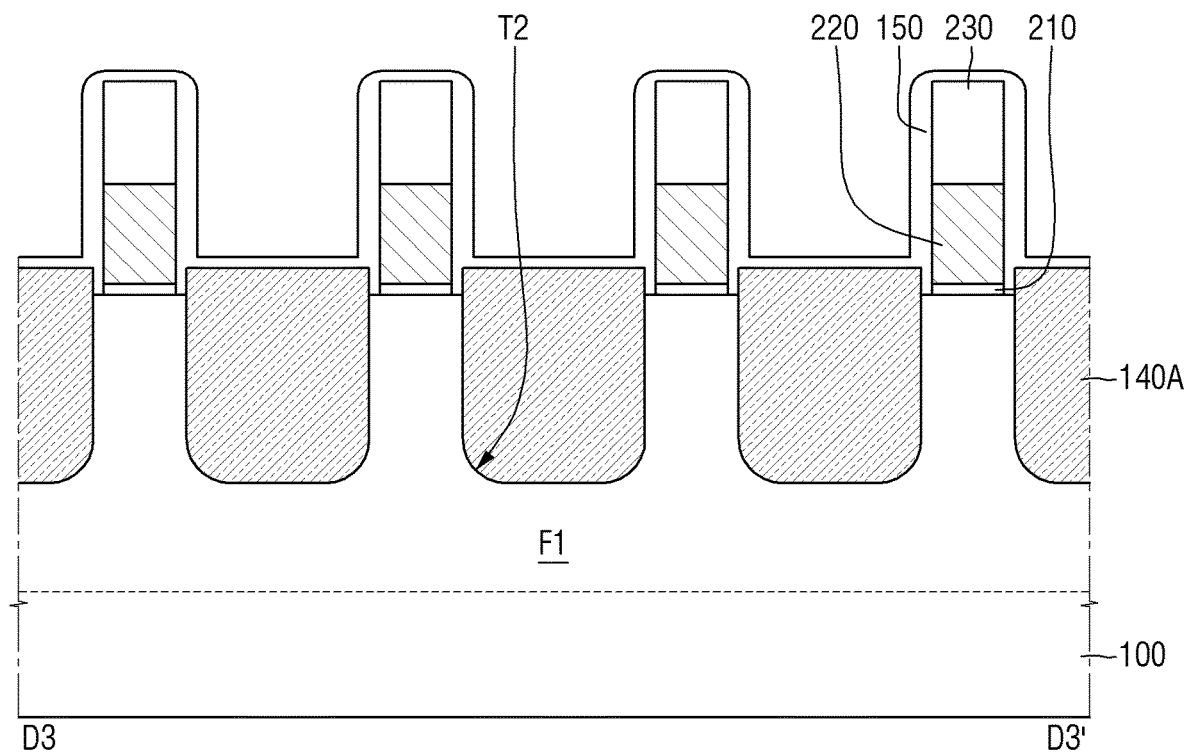
Figure 34:
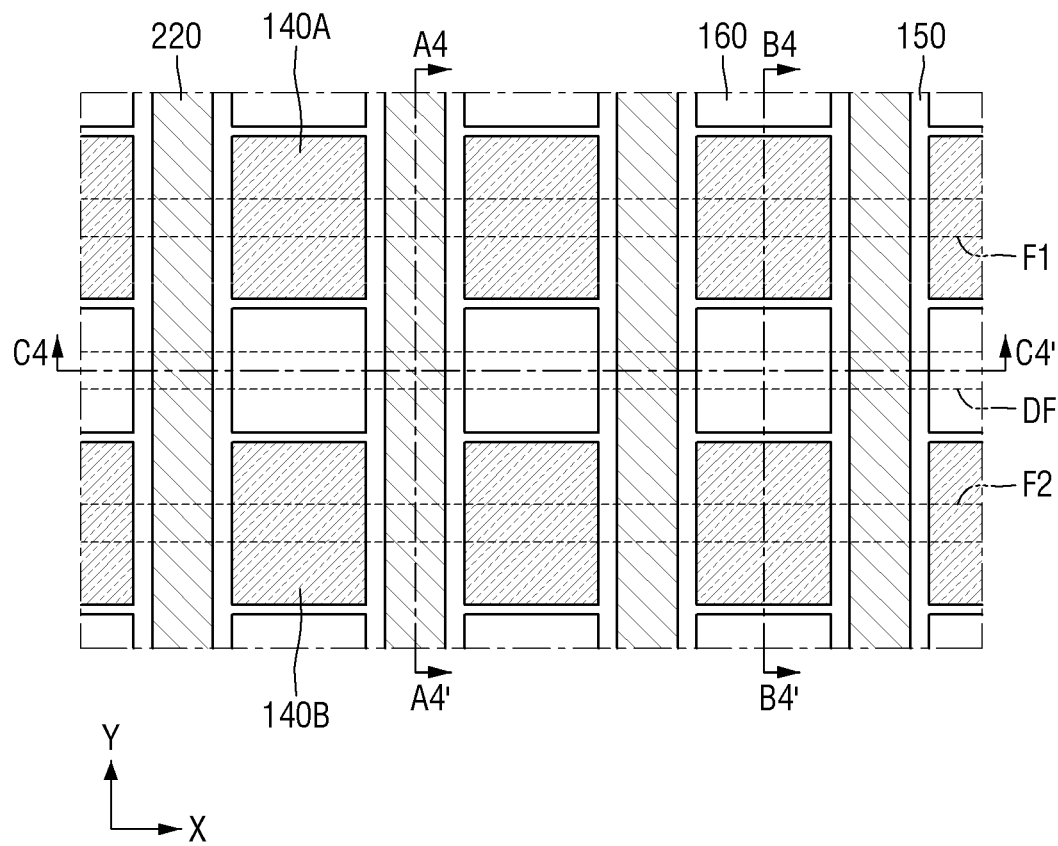

Referring to FIGS. 32 and 33, a second source/drain region 140B is formed on the second fin type pattern F2.

Since the formation of the second source/drain region 140B is substantially the same as the formation of the first source/drain region 140A, the detailed description thereof will not be provided below.

Also, in some embodiments, the second source/drain region 140B may be formed at the same level as the first source/drain region 140A. For example, the first source/drain region 140A and the second source/drain region 140B may be simultaneously formed, using the second mask pattern M2 which overlaps the dummy fin type pattern DF and does not overlap the first fin type pattern F1 and the second fin type pattern F2.

Subsequently, an insulating film which covers the pre-insulating liner 250, the first source/drain region 140A and the second source/drain region 140B is formed.

Therefore, the insulating liner 150 may be formed. The insulating liner 150 may extend along sidewalls of the first gate electrode 124 and sidewalls of the first capping pattern 130. Also, the insulating liner 150 may extend along the upper surface of the dummy fin type pattern DF. Also, the insulating liner 150 may also be formed on the field insulation film 110, the first source/drain region 140A, and the second source/drain region 140B.

In some embodiments, the insulating liner 150 may include substantially the same material as the pre-insulating liner 250.

Figure 35:
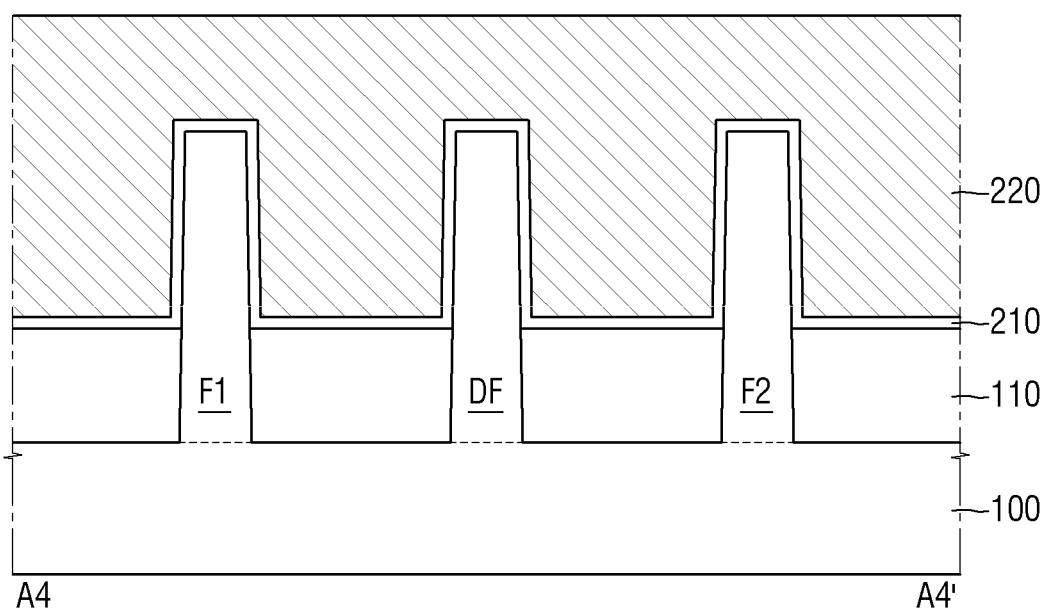
Figure 36:
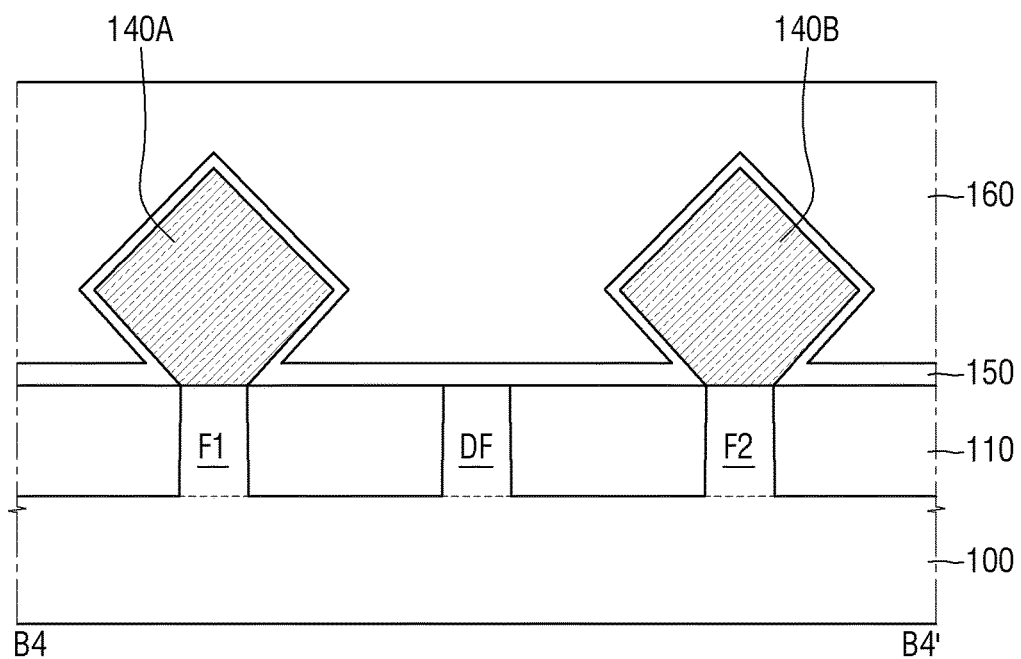
Figure 37:
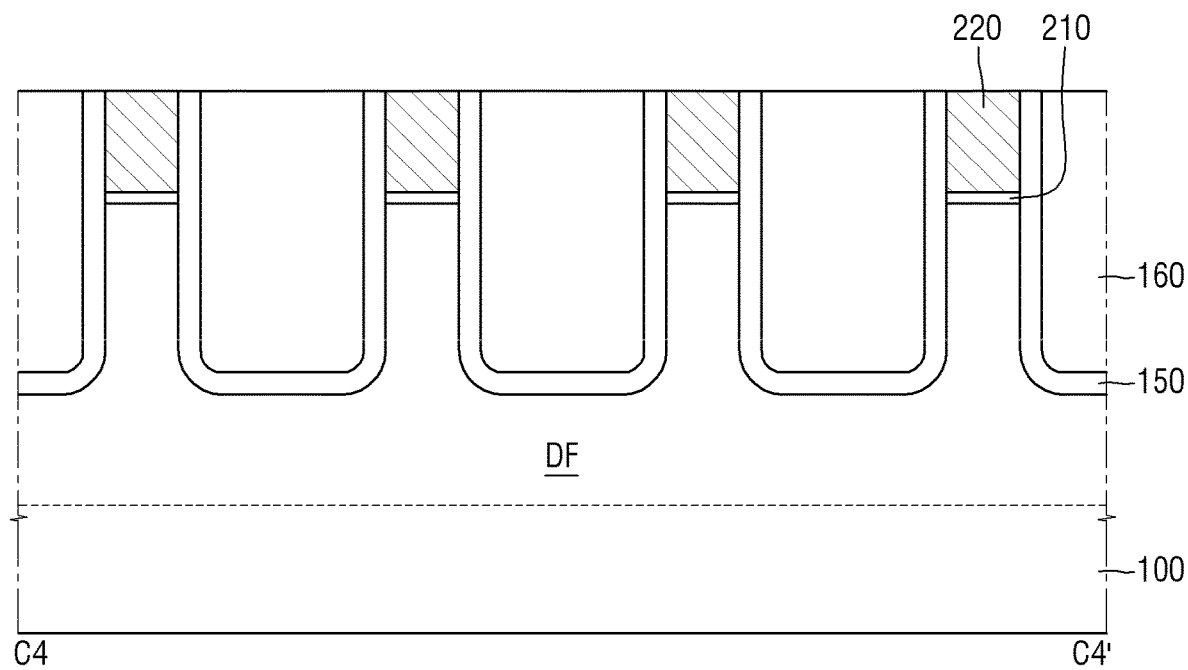

Referring to FIGS. 34 to 37, an interlayer insulating film 160 is formed on the insulating liner 150. For reference, FIG. 35 is a cross-sectional view taken along line A4-A4' of FIG. 34. FIG. 36 is a cross-sectional view taken along line B4-B4' of FIG. 34. FIG. 37 is a cross-sectional view taken along line C4-C4' of FIG. 34.

As a result, the interlayer insulating film 160 may be formed on the substrate 100 and the field insulation film 110. In addition, the interlayer insulating film 160 may surround the first gate electrode 124 and the first capping pattern 130.

The interlayer insulating film 160 may include, for example, at least one of silicon oxide, silicon nitride, and low dielectric constant material having lower dielectric constant than silicon oxynitride and silicon oxide.

Subsequently, a planarization process is performed. The planarization process may include, but is not limited to, for example, a chemical mechanical polishing (CMP) process. In some embodiments, the planarization process may be performed until the upper surface of the dummy gate electrode 220 is exposed.

Figure 38:
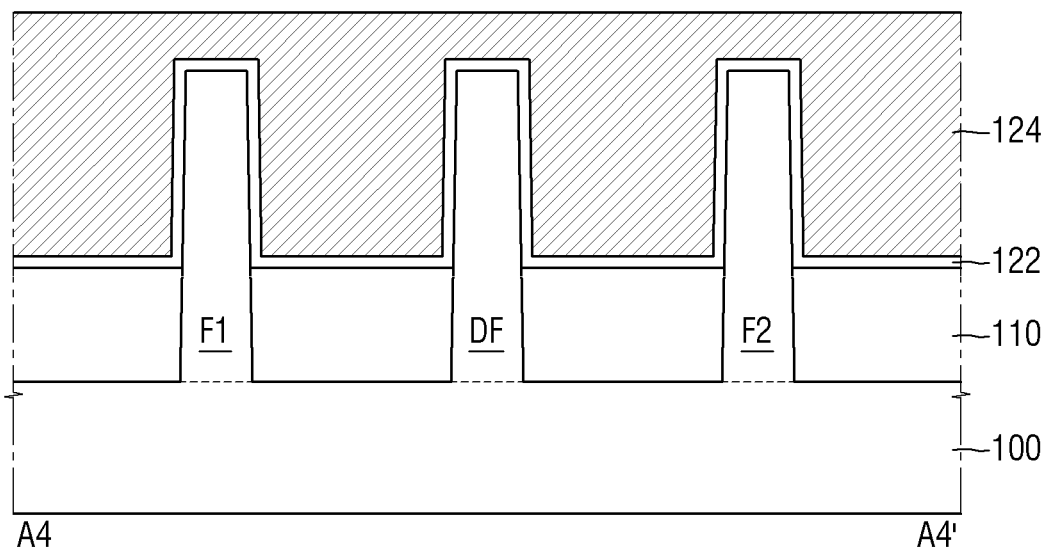
Figure 39:
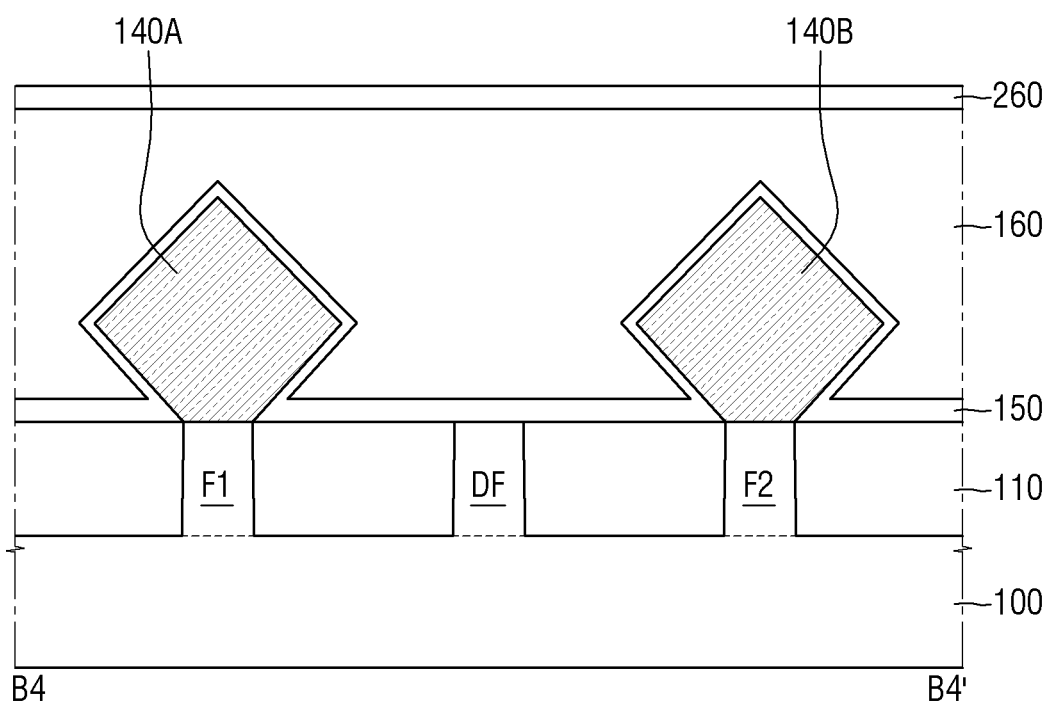
Figure 40:
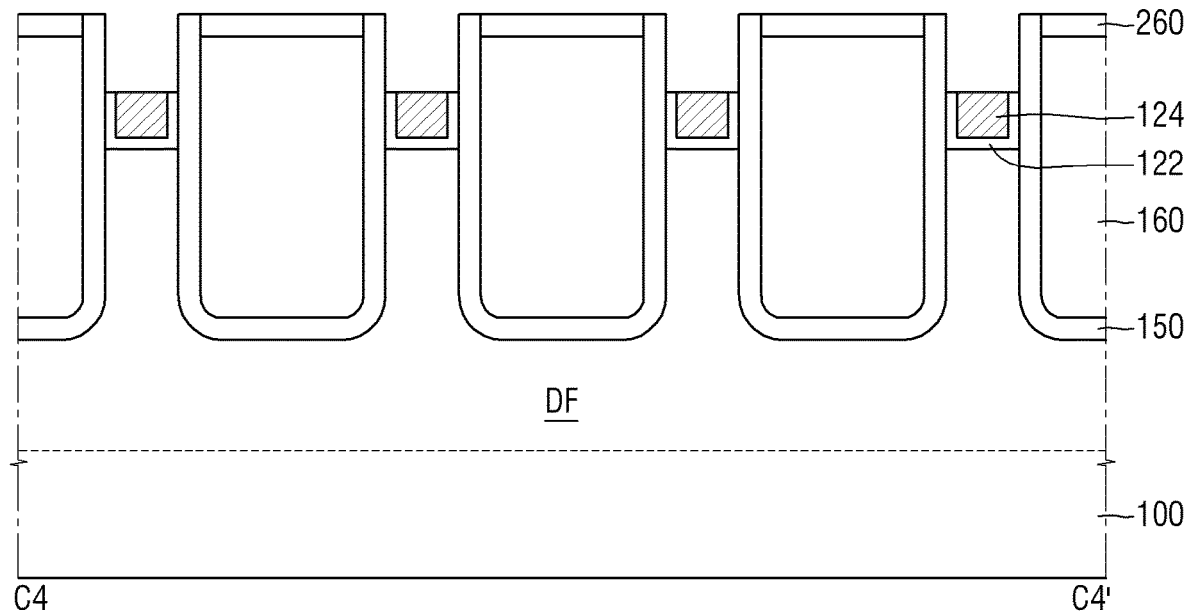

Referring to FIGS. 38 to 40, the dummy gate dielectric film 210 and the dummy gate electrode 220 are replaced with a first gate dielectric film 122 and a first gate electrode 124.

First, the dummy gate dielectric film 210 and the dummy gate electrode 220 are removed, and the insulating film and the conductive film may be sequentially formed. Next, a recessing process of recessing the upper parts of the insulating film and the conductive film may be performed. Thus, the first gate dielectric film 122 and the first gate electrode 124 extending in the second direction Y may be formed on the substrate 100.

The recess process may be performed until the upper surface of the first gate electrode 124 becomes lower than the upper surface of the insulating liner 150. Accordingly, the first gate dielectric film 122 and the first gate electrode 124 may fill a part of a space defined by the insulating liner 150.

In some embodiments, the method may further include a step of forming a protective pattern 260 on the interlayer insulating film 160, after removing the dummy gate dielectric film 210 and the dummy gate electrode 220. The protective pattern 260 may protect the interlayer insulating film 160 from the recess process.

Figure 41:
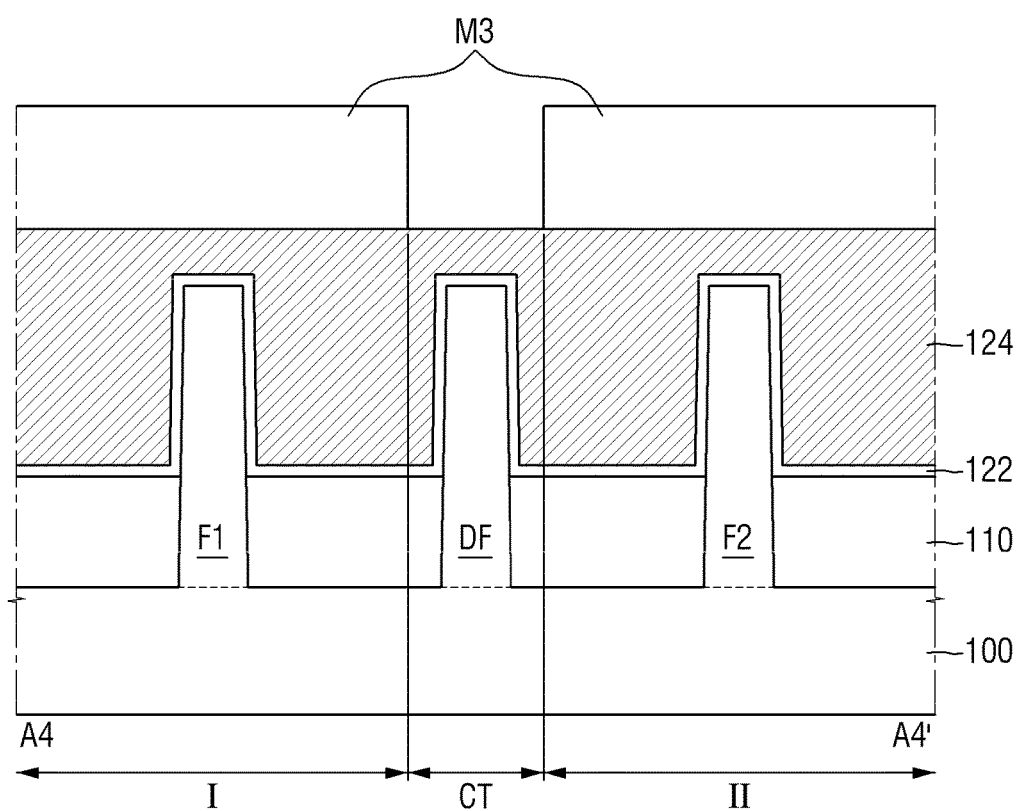
Figure 42:
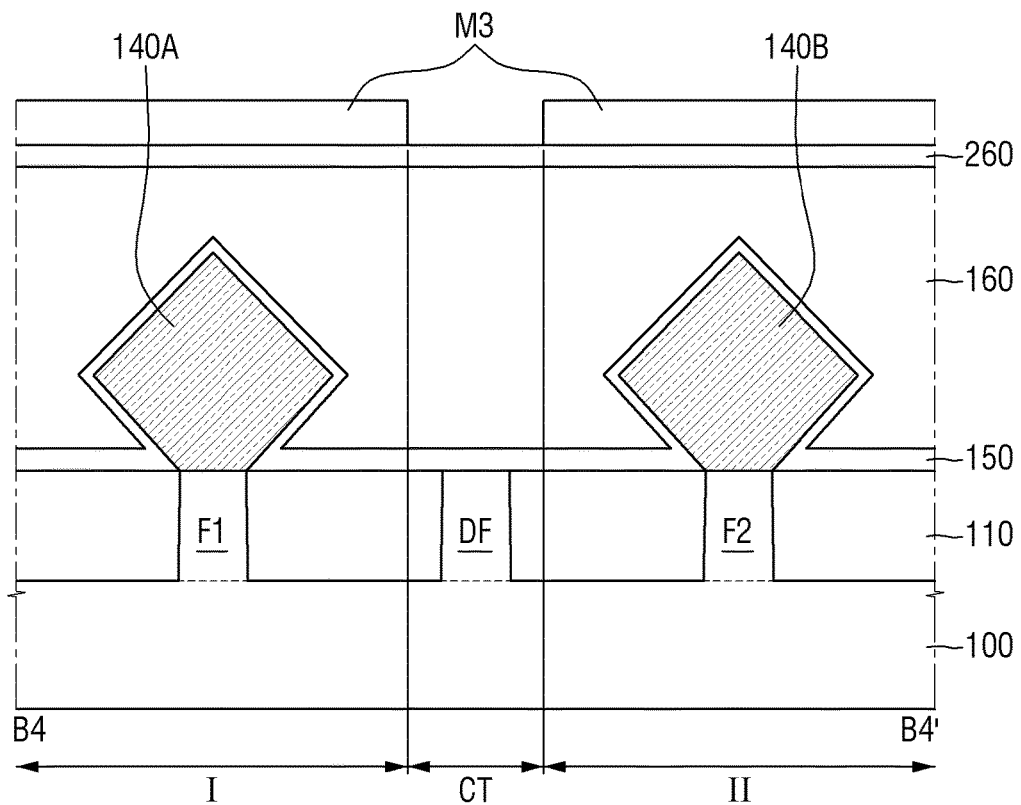
Figure 43:
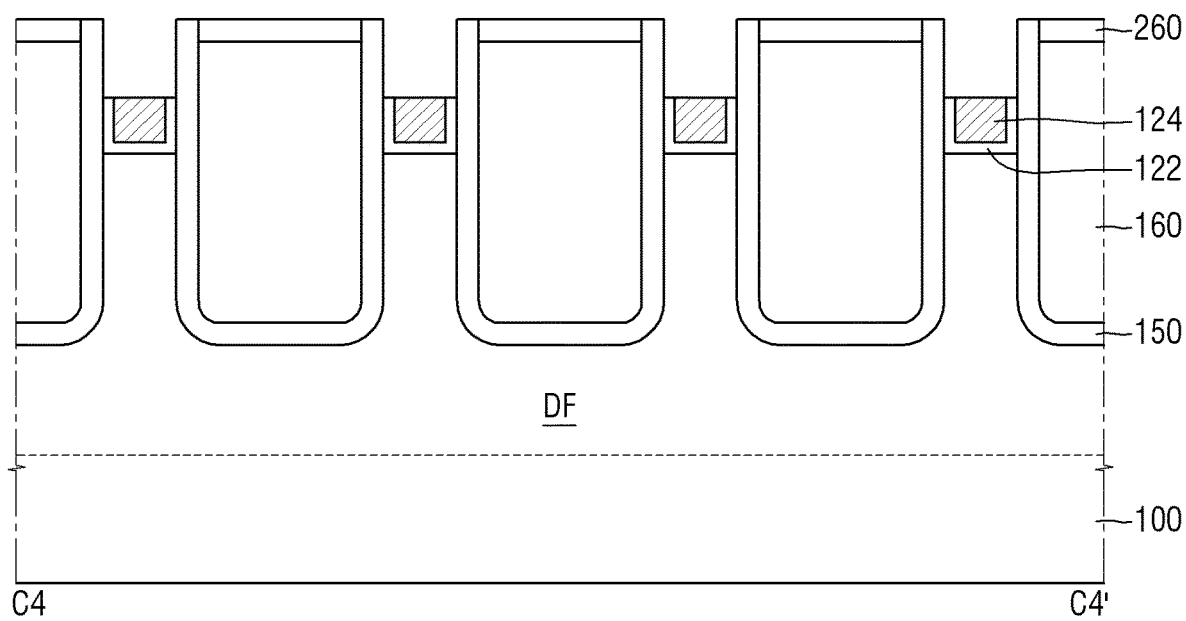

Referring to FIGS. 41 to 43, a third mask pattern M3 for exposing the separation region CT is formed.

For example, the third mask pattern M3 which overlaps the first fin type pattern F1 and the second fin type pattern F2 and does not overlap the dummy fin type pattern DF may be formed. As a result, the first gate electrode 124 on the dummy fin type pattern DF may be exposed.

The third mask pattern M3 may include, but is not limited to, for example, a photoresist.

Figure 44:
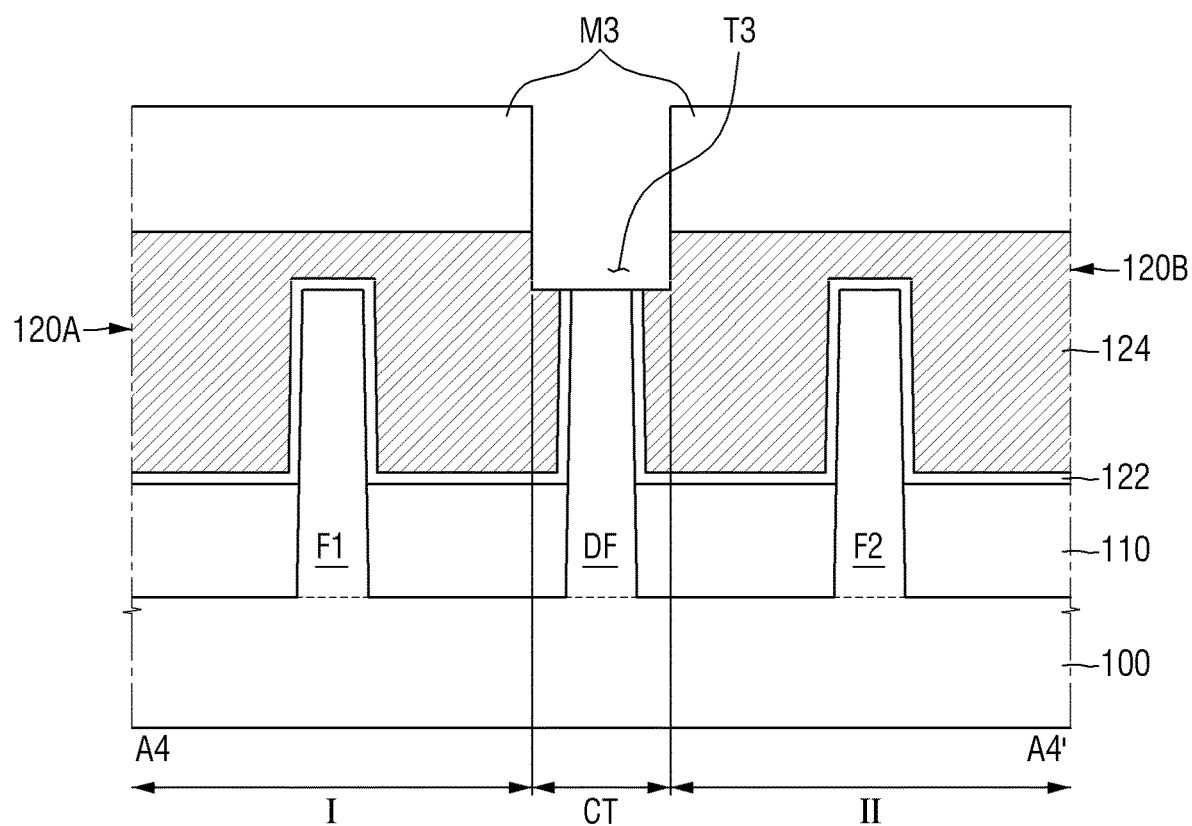
Figure 45:
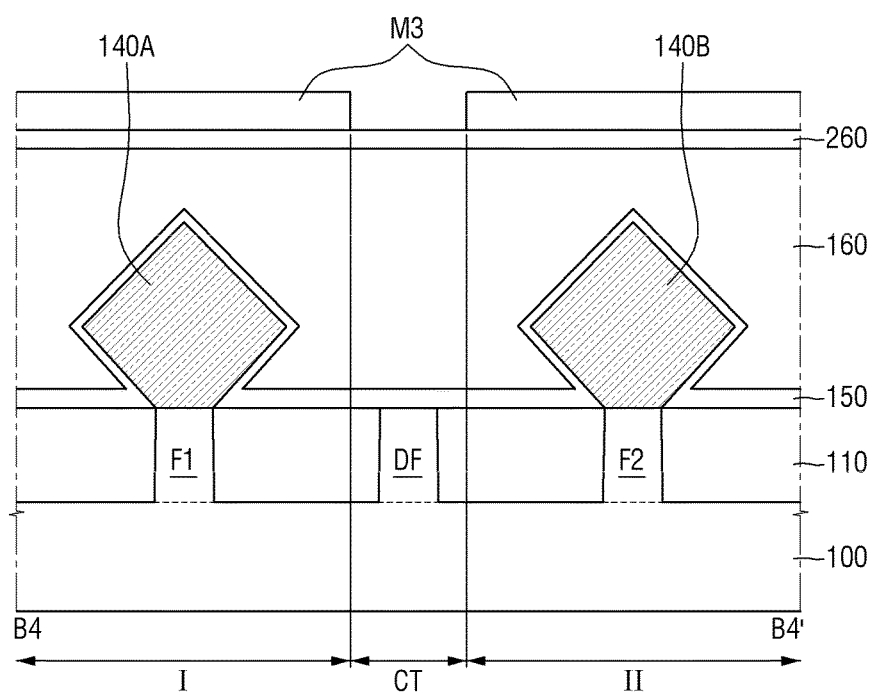
Figure 46:
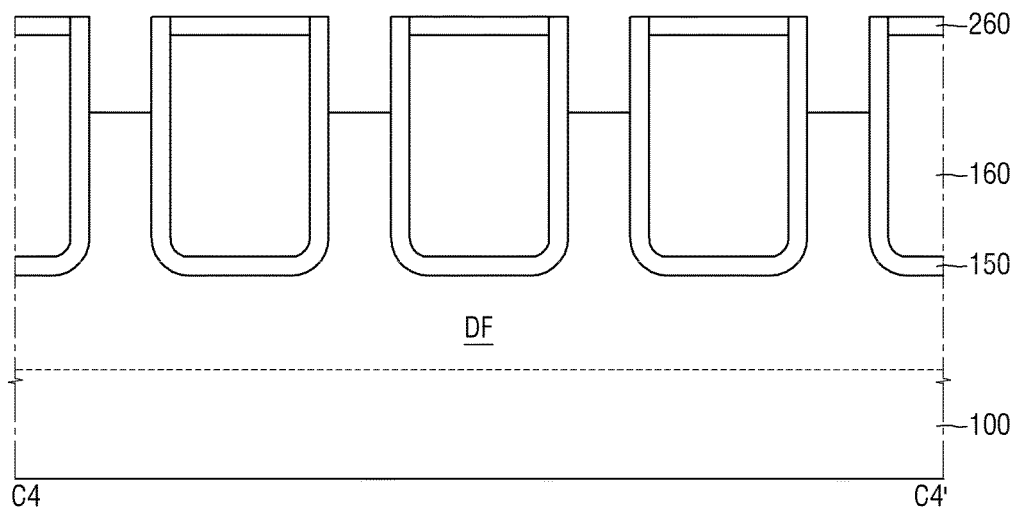

Referring to FIGS. 44 to 46, a part of the first gate electrode 124 is etched until the upper surface of the dummy fin type pattern DF is exposed, using the third mask pattern M3 as an etching mask.

As a result, the third trench T3 for exposing the upper surface of the dummy fin type pattern DF may be formed in the first gate electrode 124. In addition, the first gate electrode 124 is cut and the first gate structure 120A and the second gate structure 120B may be formed. The first gate structure 120A may extend in the second direction Y on the first fin type pattern F1, and the second gate structure 120B may extend in the second direction Y on the second fin type pattern F2.

In FIG. 44, the lower surface of the third trench T3 is illustrated to have the same height as the upper surface of the dummy fin type pattern DF, but the technical idea of the present disclosure is limited thereto. In some embodiments, the lowest surface of the third trench T3 may be formed to be lower than or the same as the upper surface of the dummy fin type pattern DF. However, in some embodiments, the lowest surface of the third trench T3 may be formed to be higher than the upper surface of the field insulation film 110.

In FIGS. 45 and 46, the protective pattern 260 exposed by the third mask pattern M3 is illustrated as not being etched, but the technical idea of the present disclosure is limited thereto. For example, a part of the protective pattern 260 exposed by the third mask pattern M3 may not be etched.

After the third trench T3 is formed, the third mask pattern M3 may be removed.

Next, referring to FIGS. 1 to 5, the first capping pattern 130 is formed on the first gate electrode 124 and the dummy fin type pattern DF, and the planarization process is performed.

Accordingly, the first capping pattern 130 extending long along the second direction Y may be formed. Further, the first capping pattern 130 may include a separation part 134 protruding downward and coming into contact with the dummy fin type pattern DF. That is, the separation part 134 that fills the third trench T3 of FIG. 44 may be formed.

The planarization process may include, but is not limited to, for example, a chemical mechanical polishing (CMP) process. In some embodiments, the planarization process may be performed until the upper surface of the interlayer insulation film 160 is exposed. Alternatively, in some embodiments, the planarization process may be performed until the upper surface of the first gate electrode 124 is exposed. As a result, the first capping pattern 130 which does not include the extension part 132 may be formed.

Conventionally, a gate cut may be used to provide semiconductor elements separated from each other. For example, by forming a structure which cuts the dummy gate electrode, and by performing a replacement process of replacing the dummy gate electrode with the gate electrode, a gate cut may be provided. However, along with the higher integration of the semiconductor device, there may be a problem that the dummy gate electrode is not completely removed during the process of removing the dummy gate electrode.

In order to reduce or prevent this problem, after the replacement process, a structure for cutting the gate electrode may be formed to provide a gate cut. However, during the process of cutting the gate electrode including the metal film or the like after the replacement process, the components other than the gate electrode may be damaged.

However, in the semiconductor device according to some embodiments, it is possible to reduce or minimize the depth at which the gate electrode is etched using the dummy fin type pattern DF formed in the separation region CT. For example, as described above with reference to FIGS. 44 to 46, only until the upper surface of the dummy fin type pattern DF is exposed, the first gate electrode 124 may be etched to cut the first gate electrode 124. Thus, since damage to the interlayer insulating film 160 and the like may be reduced or minimized, a semiconductor device with improved reliability may be provided.

In concluding the detailed description, those skilled in the art will appreciate that many variations and modifications may be made to example embodiments without substantially departing from the principles of the present inventive concepts. Therefore, the disclosed example embodiments are used in a generic and descriptive sense only and not for purposes of limitation.

What is claimed is:

1. A semiconductor device comprising:
   a first fin type pattern and a second fin type pattern which protrude from a substrate and are spaced apart from each other to extend in a first direction;
   a dummy fin type pattern protruding from the substrate between the first fin type pattern and the second fin type pattern;
   a first gate structure extending in a second direction intersecting with the first direction, on the first fin type pattern;
   a second gate structure extending in the second direction, on the second fin type pattern; and
   a capping pattern extending in the second direction, on the first gate structure and the second gate structure,
   wherein the capping pattern includes a separation part which is in contact with an upper surface of the dummy fin type pattern, and
   the dummy fin type pattern and the separation part separate the first gate structure and the second gate structure.

2. The semiconductor device of claim 1, wherein the dummy fin type pattern includes a semiconductor material, and the separation part includes an insulating material.

3. The semiconductor device of claim 1, wherein a lower surface of the separation part is lower than or at the same height as the upper surface of the dummy fin type pattern.

4. The semiconductor device of claim 1, further comprising:
an insulating liner extending along sidewalls of the first gate structure and side walls of the capping pattern.

5. The semiconductor device of claim 4, wherein the dummy fin type pattern includes a trench on both sides of the capping pattern, and
the insulating liner further extends along the lower surface and the sidewalls of the trench.

6. The semiconductor device of claim 4, further comprising:
a source/drain region in the first fin type pattern on both sides of the first gate structure,
wherein the insulating liner further extends along an outer surface of the source/drain region.

7. The semiconductor device of claim 1, further comprising:
a first source/drain region in the first fin type pattern on both sides of the first gate structure.

8. The semiconductor device of claim 7, further comprising:
a second source/drain region in the second fin type pattern on both sides of the second gate structure,
wherein the first source/drain region and the second source/drain region include impurities of the same conductivity type.

9. The semiconductor device of claim 7, wherein the first fin type pattern includes a trench on both sides of the first gate structure, and
the first source/drain region fills the trench.

10. The semiconductor device of claim 1, wherein a width of the capping pattern on the dummy fin type pattern is smaller than a width of the capping pattern on the first fin type pattern.

11. A semiconductor device comprising:
a dummy fin type pattern which protrudes from a substrate and extends in a first direction;
a first gate electrode which extends in a second direction intersecting with the first direction, on the dummy fin type pattern;
a first capping pattern which extends in the second direction and is in contact with the dummy fin type pattern, on the first gate electrode;
an insulating liner extending along sidewalls of the first gate electrode and sidewalls of the first capping pattern; and
an interlayer insulating film on the insulating liner,
wherein the first gate electrode is electrically separated by the dummy fin type pattern and the first capping pattern,
the dummy fin type pattern includes a trench on both sides of the first capping pattern, and
the insulating liner further extends along the lower surface and the sidewalls of the trench.

12. The semiconductor device of claim 11, wherein the first capping pattern includes:
an extension part extending along the second direction on the first gate electrode, and
a separation part which protrudes downward from the lower surface of the extension part and is in contact with the dummy fin type pattern.

13. The semiconductor device of claim 11, wherein the dummy fin type pattern is spaced apart from the interlayer insulating film by the insulating liner.

14. The semiconductor device of claim 11, wherein the interlayer insulating film fills a remaining region of the trench in which the insulating liner is formed.

15. The semiconductor device of claim 11, further comprising:
a second gate electrode spaced apart from the first gate electrode and extending in the second direction, on the dummy fin type pattern; and
a second capping pattern on the second gate electrode,
wherein the second gate electrode is not electrically separated by the dummy fin type pattern and the second capping pattern.

16. The semiconductor device of claim 11, wherein the insulating liner includes silicon nitride.

17. A semiconductor device comprising:
a dummy fin type pattern protruding from a substrate and extending in a first direction;
a field insulation film which surrounds a part of sidewalls of the dummy fin type pattern, on the substrate;
a capping pattern which is in contact with an upper surface of the dummy fin type pattern, on the dummy fin type pattern; and
a gate electrode extending in a second direction intersecting with the first direction and electrically separated by the dummy fin type pattern and the capping pattern, on the field insulation film,
wherein a lower surface of the capping pattern is lower than or at the same height as the upper surface of the dummy fin type pattern and is higher than the upper surface of the field insulation film.

18. The semiconductor device of claim 17, wherein the capping pattern includes:
an extension part extending along the second direction on the gate electrode, and
a separation part which protrudes downward from the lower surface of the extension part and is in contact with the dummy cm type pattern.

19. The semiconductor device of claim 17, wherein the capping pattern includes silicon nitride.

20. The semiconductor device of claim 17, wherein the upper surface of the dummy fin type pattern is lower than the upper surface of the gate electrode.

\* \* \* \* \*